(12) United States Patent
Kimura et al.

(10) Patent No.: US 9,759,613 B2
(45) Date of Patent: Sep. 12, 2017

(54) TEMPERATURE SENSOR DEVICE AND RADIATION THERMOMETER USING THIS DEVICE, PRODUCTION METHOD OF TEMPERATURE SENSOR DEVICE, MULTI-LAYERED THIN FILM THERMOPILE USING PHOTO-RESIST FILM AND RADIATION THERMOMETER USING THIS THERMOPILE, AND PRODUCTION METHOD OF MULTI-LAYERED THIN FILM THERMOPILE

(75) Inventors: Mitsuteru Kimura, Miyagi (JP); Nobuo Tanaka, Mie (JP); Hironori Shimobayashi, Mie (JP)

(73) Assignees: HME CO., LTD., Kuwana-Shi (JP); TOHOKU GAKUIN, Sendai-Shi (JP)

(*) Notice: Subject to any disclaimer, the term of this patent is extended or adjusted under 35 U.S.C. 154(b) by 869 days.

(21) Appl. No.: 13/643,723

(22) PCT Filed: Apr. 26, 2011

(86) PCT No.: PCT/JP2011/060129
§ 371 (c)(1),
(2), (4) Date: May 30, 2013

(87) PCT Pub. No.: WO2011/136203
PCT Pub. Date: Nov. 3, 2011

(65) Prior Publication Data
US 2014/0036953 A1    Feb. 6, 2014

(30) Foreign Application Priority Data

Apr. 26, 2010  (JP) .................................. 2010-100578
Mar. 2, 2011   (JP) .................................. 2011-044604

(51) Int. Cl.
*G01J 5/12*   (2006.01)
*G01K 7/02*   (2006.01)
(Continued)

(52) U.S. Cl.
CPC . *G01J 5/02* (2013.01); *G01J 5/16* (2013.01); *G01K 7/01* (2013.01); *H01L 35/08* (2013.01); *G01J 2005/106* (2013.01)

(58) Field of Classification Search
CPC ..................................... G01J 5/12; G01K 7/02
See application file for complete search history.

(56) References Cited

U.S. PATENT DOCUMENTS 3,751,798 A * 8/1973 Altshuler ................ H01L 35/34
                                                          136/225
4,538,464 A * 9/1985 Wheatley ................. G01H 3/10
                                                          136/212
(Continued)

FOREIGN PATENT DOCUMENTS

CN   1488070       4/2004
JP   58171873 A * 10/1983 ............. H01L 35/08
(Continued)

OTHER PUBLICATIONS

International Search Report PCT/JP2011/060129, dated Jul. 26, 2011.
(Continued)

*Primary Examiner* — Gail Kaplan Verbitsky
(74) *Attorney, Agent, or Firm* — Young & Thompson

(57) ABSTRACT

Disclosed are a temperature sensor device using a thermopile, the total number n of thermocouples thereon can be increased without greatly increasing the internal resistance of the thermopile r, providing high output level and high S/N ratio, a highly sensitive radiation thermometer using the device, and production method of the device using organic material for thin films to form the thermopile. These provide a standardized inexpensive multi-layered thin film thermopile, a radiation thermometer with high sensitivity, and production method of these devices. The temperature sensor device is a device wherein a thermopile which is formed on (Continued)

a thin film thermally isolated from a substrate is place in a temperature sensing part, and the thin film is formed as a multi-layered thin film, a layered thermopile is formed on each layered thin film, the substrate functioning as a heat sink which is one junction of the reference temperature of the thermopile.

1 Claim, 17 Drawing Sheets

(51) Int. Cl.
  *G01J 5/02* (2006.01)
  *G01J 5/16* (2006.01)
  *G01K 7/01* (2006.01)
  *H01L 35/08* (2006.01)
  *G01J 5/10* (2006.01)

(56) References Cited

U.S. PATENT DOCUMENTS

| | | | | |
|---|---|---|---|---|
| 4,722,612 A * | 2/1988 | Junkert | G01J 5/02 | 136/230 |
| 5,033,866 A * | 7/1991 | Kehl | G01K 17/00 | 136/225 |
| 5,288,147 A * | 2/1994 | Schaefer | G01K 17/00 | 136/225 |
| 5,393,351 A * | 2/1995 | Kinard | H01L 35/08 | 136/200 |
| 5,689,087 A * | 11/1997 | Jack | G01K 7/02 | 136/213 |
| 5,909,004 A * | 6/1999 | Hedengren | G01K 3/14 | 136/201 |
| 6,750,452 B1 * | 6/2004 | Morita | G01J 5/20 | 250/338.1 |
| 6,777,961 B2 * | 8/2004 | Hamamoto | G01J 5/12 | 136/227 |
| 6,781,128 B2 * | 8/2004 | Hirota | G01J 5/08 | 250/332 |
| 6,949,286 B2 * | 9/2005 | Nakajima | C04B 35/14 | 250/338.4 |
| 7,282,712 B2 * | 10/2007 | Shibayama | G01J 5/12 | 250/338.1 |
| 7,338,640 B2 * | 3/2008 | Murthy | G01N 25/4893 | 374/10 |
| 7,635,605 B2 * | 12/2009 | Shibayama | G01J 5/10 | 257/E21.522 |
| 7,785,002 B2 * | 8/2010 | Dewes | G01K 7/028 | 136/200 |
| 8,809,980 B2 * | 8/2014 | Nakatani | G01J 5/02 | 250/338.1 |
| 9,054,272 B2 * | 6/2015 | Savelli | H01L 35/32 | |
| 9,500,529 B2 * | 11/2016 | Noguchi | G01J 5/0225 | |
| 2003/0111605 A1 * | 6/2003 | Sato | G01J 5/16 | 250/338.4 |
| 2003/0133489 A1 * | 7/2003 | Hirota | G01J 5/08 | 374/121 |
| 2003/0147449 A1 * | 8/2003 | Chavan | G01J 5/14 | 374/137 |
| 2003/0205670 A1 | 11/2003 | Shibayama | | |
| 2004/0040592 A1 * | 3/2004 | Schneider | G01K 7/021 | 136/224 |
| 2005/0081905 A1 * | 4/2005 | Lan | G01K 7/04 | 136/224 |
| 2007/0095380 A1 * | 5/2007 | Dewes | G01J 5/12 | 136/224 |
| 2007/0141804 A1 * | 6/2007 | Sankarapillai | H01L 21/6835 | 438/455 |
| 2007/0227575 A1 | 10/2007 | Kato et al. | | |
| 2008/0128620 A1 * | 6/2008 | Krellner | G01J 5/041 | 250/338.1 |
| 2009/0114819 A1 * | 5/2009 | Yamanaka | G01J 5/10 | 250/338.4 |
| 2010/0012357 A1 * | 1/2010 | Wang | H05K 3/0052 | 174/255 |
| 2010/0032788 A1 * | 2/2010 | Ulbrich | G01J 5/02 | 257/464 |
| 2010/0265989 A1 * | 10/2010 | Dewes | G01K 7/028 | 374/179 |
| 2012/0138800 A1 * | 6/2012 | Meinel | G01J 5/12 | 250/338.4 |
| 2012/0213245 A1 * | 8/2012 | Noda | G01J 5/0896 | 374/44 |
| 2013/0093037 A1 * | 4/2013 | Kirihara | G01J 5/04 | 257/435 |
| 2013/0250997 A1 * | 9/2013 | Greenfield | G01K 11/00 | 374/161 |
| 2015/0054114 A1 * | 2/2015 | Quad | G01J 5/0225 | 257/467 |

FOREIGN PATENT DOCUMENTS

| | | | | |
|---|---|---|---|---|
| JP | 59163526 A | * | 9/1984 | H01L 35/08 |
| JP | 63-108762 | | 5/1988 | |
| JP | 64-029721 | | 1/1989 | |
| JP | 2-165025 | | 6/1990 | |
| JP | 3-109028 | | 11/1991 | |
| JP | 3-248477 | | 11/1991 | |
| JP | 5-090553 | | 4/1993 | |
| JP | 6-260686 | | 9/1994 | |
| JP | 8-285680 | | 11/1996 | |
| JP | 2000-077804 | | 3/2000 | |
| JP | 2001-066182 | | 3/2001 | |
| JP | 2003-177062 | | 6/2003 | |
| JP | 2004-020407 | | 1/2004 | |
| JP | 2004-031684 | | 1/2004 | |
| JP | 2005-324320 | | 11/2005 | |
| JP | 2006-105651 | | 4/2006 | |
| JP | 2006-203040 | | 8/2006 | |
| WO | WO02/075262 | | 9/2002 | |
| WO | WO 2010/090188 | | 8/2010 | |

OTHER PUBLICATIONS

Japanese Office Action for Application No. 2015-135696 dated Aug. 3, 2016.

* cited by examiner (a)

(b)

(c)

(a)

(b)

(c)

(a)

(b)

(a)   (b)

TEMPERATURE SENSOR DEVICE AND RADIATION THERMOMETER USING THIS DEVICE, PRODUCTION METHOD OF TEMPERATURE SENSOR DEVICE, MULTI-LAYERED THIN FILM THERMOPILE USING PHOTO-RESIST FILM AND RADIATION THERMOMETER USING THIS THERMOPILE, AND PRODUCTION METHOD OF MULTI-LAYERED THIN FILM THERMOPILE

TECHNICAL FIELD

The first invention of the present application relates to a technology to increase the sensitivity of a thermopile which is a temperature sensor by forming a multi-layered thin film. The first invention provides a temperature sensor as a thermal infrared sensor which receives radiation light such as infrared light, a temperature sensor which detects the temperature change of fluid including gas, a temperature sensor device with increased sensitivity based on the thermopile which is used as a temperature sensor for heat analysis, and a production method of a radiation thermometer and a temperature sensor device using the sensor.

The second invention of the present application relates to a multi-layered thin film thermopile wherein a temperature sensing area is made of multi-layered thin films to increase the sensitivity of a thermopile as a temperature sensor. Photo-resist films are used to form a multi-layered thin film thermopile because it is easy to form multi-layered thin films with a desired size and shape, and especially because it is easy to form a hole which connects thermopiles, each of them placed on and under a layered thin film. The second invention provides a multi-layered thin film thermopile using photo-resist film which enables low cost production of a thermopile with high sensitivity and high accuracy used for applications such as a temperature sensor with high sensitivity as a thermal infrared sensor which receives radiation light such as infrared light, a temperature sensor which detects the temperature and its change of fluid including gas, the current velocity of fluid, and so on, and a temperature sensor for heat analysis, and so on. And also the second invention provides a radiation thermometer using the thermopile, and a production method of a multi-layered thin film thermopile.

BACKGROUND ART

Background Art on the First Invention

A thermopile is a thermo-type sensor, and also a temperature difference sensor, which is configured to obtain greater thermoelectric power, which is a sensor output, for a given temperature difference $\Delta T$ by connecting a plurality of thermocouples in series.

A thermo-type sensor is classified as an absolute temperature sensor such as a thermistor, and a temperature difference sensor such as a thermocouple and a thermopile. A temperature difference sensor detects only temperature difference so that null-balance method can be applied to this type of sensor wherein a temperature difference of a point from a reference temperature of a given point can be accurately detected, therefore a thermo-type sensor with high accuracy can be provided (Patent Document 1). Because of this, a thermopile is generally used for a high-accuracy infrared temperature sensor such as an aural thermometer (Patent Document 2).

Under a given temperature difference $\Delta T$, the output level of a thermopile, consisting of a combination of thermocouples made of the same thermoelectric material, is proportionate to the number of the thermocouples thereof. A case where a thermopile is used for a light receiving part of an infrared sensor is taken for example. When a thermopile is formed on an isometric light receiving part, the output level of the thermopile increases if the total number n of thermocouples increases, but then the width of each thermocouple needs to be narrower. A hot junction of a thermocouple, which is a junction when infrared light is received from an object with a temperature higher than ambient temperature, is formed near the center of a light receiving membrane, which is a thin film in the form of a diaphragm thermally isolated from a substrate. And a cold junction of a thermocouple is formed on a heat sink surrounding and supporting the light receiving membrane. Accordingly, even a simple calculation for the case when a light receiving membrane is fully covered by a thermopile with totally n thermocouples shows that each thermocouple need to be formed with a width of 1/n of a pair of reference thermocouple. In addition, n thermocouples are connected in series, so that its internal resistance r increases at rate proportional to the square of n over the internal resistance of a pair of reference thermocouple. The validity of this rule of the square of n is approximately confirmed by an experiment done on a test production. In such a way, an internal resistance r increases 4 times higher as the total number of thermocouples n increases 2 times higher. High internal resistance r increases Johnson noise, which is not preferable for the application as a sensor. The S/N ratio of a thermopile as a sensor degrades due to the increase of internal resistance r, which tightens restrictions on the total number of thermocouples n. Accordingly, it has been a problem to be solved how to increase the total number of thermocouples n with keeping at the same time low internal resistance r for an isometric area using the same thermoelectric material.

Generally speaking, thermoelectric material with high resistivity has large Seebeck coefficient. And also efforts have been made to increase the output of a thermopile without increasing the total number n of thermocouples. Eventually a trade-off relationship comes out between the output of a thermopile and S/N ratio subject to an internal resistance r. Therefore, a thermopile has been fabricated at the middle ground of the trade-off.

The Second Invention

As a prior patent application, the applicant of the present invention has invented "a temperature sensor device, a radiation thermometer using the device, and a production method of a temperature sensor device" (JP-A-2010-100, 578), which is an original patent application of a multi-layered thin film thermopile. This invention has disclosed a composite thermopile which is formed as multi-layered thin films wherein layered thermopiles are connected in series via through-holes of each layered thin film, each layered thermopile is formed wherein many thermocouples made of Bi and Sb as thermo-electric material are placed on a layered thin film and are connected in series, the layered thin film is PET (polyethylene terephthalate) film about 5 µm in thickness which is an organic material film. However, there exist some problems in the technology disclosed by this invention which need to be improved for mass production. For example, production method is complicated having processes such as a process to paste a plurality of PET films to form multi-layered thin films and a process to form through-holes to connect an upper layered thermopile with lower one, and silver paste needs to be unfavorably used for the connection.

Furthermore, it is also a problem in this technology, when an inorganic material other than photo-resist film is selected such as silicon oxide for the material of each layered thin film, that many processes are necessary such as a process to form each layered thin film, a process to form photo-resist film, a process to expose the photo-resist film and make patterns thereon, a process to etch and remove each layered thin film using the photo-resist film as an etching mask, and a process to remove the photo-resist mask, and that the repetition of these processes due to its multiple structure increases further the number of processes and production cost, which results in an expensive multi-layered thin film thermopile.

In the conventional fabrication process of a thermopile, a cavity by which a thin film is thermally isolated from a substrate needs to be formed in the almost last stage of the process. And anisotropic etchant liquid (etchant) of silicon is strongly-alkaline and it solves organic materials and most of metals, therefore materials for the thin film for thermal separation from the substrate have to be selected from materials which are not solved by the etchant. Accordingly, only materials can be left behind which are not solved by the etchant for the thin film used for thermal separation from the substrate, which entails strict limitation on its fabrication process.

CITATION LIST

Patent Documents

Patent Document 1: Japanese Unexamined Patent Application Publication No. 2002-573629 (WO2002/075262)
Patent Document 2: Japanese Unexamined Patent Application Publication No. 2004-31684

DISCLOSURE OF INVENTION

Problem to be Solved by the Invention

The First Invention

The object of the first invention is to provide a production method in which multi-layered thin films of laminated thermopiles are constructed by organic material in order to obtain high output level and high S/N ratio for the total number n of thermocouples thereon to be increased without increasing the internal resistance of the thermopile r so notably, and a temperature sensor device is easily produced; the temperature sensor device using the thermopiles comprised of the multi-layered thin films produced by the production method; and a highly sensitive radiation thermometer using the device.

The Second Invention

The object of the second invention is to solve aforementioned problems and to provide a standardized, low cost multi-layered thin film thermopile with high sensitivity, a production method thereof, and a radiation thermometer with high sensitivity using the thermopile, by means of the features that multi-layered thin films composed of layered thin films thermally isolated from a substrate by a cavity can be easily formed in a given shape, thickness, and size, on the cavity in a given shape, and that the multi-layered thin film can be reinforced which is thermally isolated from the substrate, and that through-halls can be formed at a given position on a layered thin film, and that upper thermopiles can be easily connected with lower thermopiles via the through-holes.

Means for Solving Problem

The First Invention

To achieve the aforementioned object, a temperature sensor device of the present invention, wherein one or several composite thermopiles are placed in one or several temperature sensing parts, the composite thermopiles being made of multi-layered thin films comprising a plurality of layered thermopiles thermally isolated from a substrate, characterized in that the thin film is equipped with a plurality of connected multi-layered thin films, and in that layered thermopiles are respectively formed on layered thin films which constitute the multi-layered thin films, and in that one of two junctions, either a cold junction, or a hot junction of thermocouples which constitute the layered thermopiles are formed on the substrate, and in that the other junction is formed in the region thermally isolated from the substrate in the layered thin films, and in that the substrate having larger heat capacity than the thin film functions as a heat sink, and in that the layered thermopiles formed on the layered thin films are sequentially connected in series to form a composite thermopile so as to increase the output of the composite thermopile, and in that the temperature sensing part also functions as an infrared light receiving part, and in that the infrared light receiving part is equipped with an infrared light absorption film, and in that a heat conduction thin film which conducts heat received at the light receiving part is formed and extended until a contact point which is formed in the light receiving part, including the center of the light receiving part, and in that the heat conduction thin film is formed on the opposite side of the multi-layered thin film placed in the light receiving part from the infrared light absorption film.

Heretofore, a thermopile used for a temperature sensor device has been fabricated with a structure wherein a thin film in the form of a diaphragm (or a membrane) or a cantilever is formed on a substrate, the substrate functions as a heat sink, the thin film functions as a temperature sensing part such as an infrared light sensing part, and thermocouples are formed in array configuration and connected in series so that thermoelectric force thereof is added and maximized, the thermocouples are made of thermoelectric material with high Seebeck coefficient, opposite in polarity of thermoelectric force to the thin film, in the form of a very-narrow-shaped thin film. However, a conventional thermopile is made of thermocouples formed as a two-dimensional array on a single-layered thin film in the form of a diaphragm or a cantilever which functions as an infrared receiving part. Therefore, there is a limitation on the total number of thermocouples n to form a thermocouple array with many thermocouples (let's say an array with n thermocouples) on a given area of a temperature sensing part, being placed out of touch with each other.

According to the present invention, a thermocouple array can be fabricated as a three-dimensional array by means of laminating multiple thin films having a light receiving part with an isometric area. When the array is used for an infrared sensor, if, for example, the number of thermocouples is m which is formed on one layered thin film among multi-layered thin films (the number of thermocouples constitute a layered thermopile) and the number of multiple layers is k, then the total number of thermocouples n will be n=m·k, which is the total number of thermocouples that constitute a composite thermopile. Accordingly, the internal resistance of all the thermocouples (a composite thermopile) will be simply k times the internal resistance of thermocouples on each one layered thin film (a layered thermopile). The details will be described as follows.

Let's assume that the area of a temperature sensing part which functions as an infrared receiving part is constant. Then resistances $r_1$ and $r_k$ will be compared, wherein a resistance $r_1$ is the internal resistance of a thermopile composed of all the thermocouples for a conventional thermopile in which n pairs of thermocouples are formed on one-layered thin film, and a resistance $r_k$ is the internal resistance of a composite thermopile of the present invention in which thermocouples thereof are divided and formed on k-layered thin films and m pairs of thermocouples (a layered thermopile) are formed on each layered thin film. For comparison, the internal resistances are calculated as follows based on $r_a$, wherein $r_a$ is the internal resistance of a pair of thermocouples when only one pair of thermocouples is formed on the whole area of an isometric temperature sensing part so as to minimize the internal resistance.

The internal resistance of a pair of thermocouples $r_{o1}$ formed in the conventional thermopile wherein n pairs of thermocouples are formed on only one-layered thin film is calculated by $r_{o1}=n·r_a$. Therefore, the internal resistance of n pairs of thermocouples $r_1$ which is compounded is calculated by the following expression 1.
[Expression 1]

And also, in a composite thermopile wherein thermocouples are divided and formed on k-layered thin films and m pairs of thermocouples which constitutes a layered thermopile are formed on each layered thin film, the internal resistance of a layered thermopile $r_{0k}$ per one layer of each layered thin film is calculated by $r_{0k}=m·r_a$, And considering the total number of thermocouples n in the composite thermopile is represented by k·m, the internal resistance of n pairs of the composite thermopile $r_k$ is represented by the following expression 2.
[Expression 2]

Therefore, in a layered thermopile according to the present invention wherein k-layered thin films are laminated and thermocouples thereof are divided and formed on the films, even when the total number of thermocouples n which constitute a composite thermopile formed on an isometric light receiving area is the same as the conventional thermopile, the internal resistance of the layered thermopile is one squared $k^{th}$ part of that of the conventional thermopile, which is formed on one-layered thin film. For example, when k is 3, i.e., when 3-layered thin films are laminated, the internal resistance will be calculated as one $9^{th}$ part of that of the conventional thermopile. The reduction of the internal resistance of a composite thermopile in this way ensures the reduction of S/N ratio of a temperature sensor which enables to increase its gain, thereby to increase its sensitivity.

A thermocouple which constitutes a layered thermopile has a cold junction and a hot junction. For example, when it is used for an infrared sensor which receives infrared light, generally, a junction formed on a substrate with large heat capacity is a cold junction, and a junction formed on a thin film thermally isolated from a substrate is a hot junction, when infrared light is received from an object with higher temperature than the substrate. To the contrary, when infrared light is received from an object with lower temperature than the substrate, more heat emission from the thin film cools down the film, thereby the junction formed on the substrate becomes a hot junction. The substrate has larger heat capacity than the thin film which receives light, then the substrate is used for a heat sink, and the substrate temperature is used for a reference temperature of the thermopile.

Thermocouples which constitute a thermopile can be connected in series, in parallel, or in the combination of these. But all the thermocouples are preferably connected in series to maximize thermoelectric force of a composite thermopile having two terminals under a given temperature difference ΔT. There is an upper limit on the number of thermocouples in a layered thermopile formed on each layered thin film. Therefore, ideally it is desired to form contact points of thermocouples which constitute a layered thermopile near the center of the thin film of a light receiving part, in practice, each contact points of a thermocouple array have to be formed at a position out of the center of the thin film in consideration of the relationship between the area of each contact point and the number of thermocouples. Generally, an infrared absorption film is formed on all over the thin film which is a light receiving part. Then, the center of the thin film will be heated at the highest temperature by receiving infrared light. Needless to say, a thermal conductive thin film and an infrared absorption film can be formed on the same side on the thin film of the light receiving part. For example, after a thermal conductive thin film is formed, an infrared absorption film can be formed thereon. Metal with high electrical conductivity is preferably used for the thermal conductive film. However, it's possible to cause short circuit in the thermocouple array when a thermal conductive thin film is formed on the side of the thermocouple array which constitutes a thermopile of the light receiving part. This problem can be avoided by forming a thermal conductive thin film on the opposite side of the thin film of the light receiving part from the infrared absorption film.

A production method of a temperature sensor device according to the present invention is a method for producing a temperature sensor device wherein a composite thermopile is placed on a temperature sensing part, the composite thermopile formed by laminating layered thermopiles formed on organic layered thin films, comprising:

layered thermopile fabrication process for each layer forming the layered thermopiles on the organic layered thin films wherein the number of the layered thin films are determined for appropriate lamination;

through-holes fabrication process forming through-holes for the electrical conduction of electrodes at desired positions on the layered thin films;

overlap-bonding process overlapping and bonding the organic layered thin films to form an organic multi-layered thin film;

conduction process providing electrical conductions between upper electrodes and lower electrodes via through-holes so that the layered thermopiles formed on the layered thin films are connected in series;

substrate-bonding process bonding a substrate array and the organic multi-layered thin film, the substrate array working as a heat-sink for formed temperature sensor devices; device-separation process separating the formed temperature sensor devices.

When layered thermopiles are formed on each layered thin films using organic thin films which are laminated to form a composite thermopile, it is often difficult to form multi-layered films by sputtering or CVD which is used for a conventional micromachining technology using organic thin films. A technology with novelty to form multi-layered thin films is necessary to materialize the device according to the present invention. A production method according to the present invention is a method wherein a plurality of organic films such as PET films with layered thermopiles formed thereon are prepared, then these films are laminated to form a composite thermopile for a temperature sensor device.

A temperature sensor device the present invention is a device produced by using a production method of a temperature sensor device wherein a composite thermopile is placed on a temperature sensing part, the composite thermopile formed by laminating layered thermopiles formed on organic layered thin films, comprising:

layered thermopile fabrication process for each layer forming the layered thermopiles on the organic layered thin films wherein the number of the layered thin films are determined for appropriate lamination;

through-holes fabrication process forming through-holes for the electrical conduction of electrodes at desired positions on the layered thin films;

overlap-bonding process overlapping and bonding the organic layered thin films to form an organic multi-layered thin film;

conduction process providing electrical conductions between upper electrodes and lower electrodes via through-holes so that the layered thermopiles formed on the layered thin films are connected in series;

substrate-bonding process bonding a substrate array and the organic multi-layered thin film, the substrate array working as a heat-sink for formed temperature sensor devices;

device-separation process separating the formed temperature sensor devices.

The temperature sensor device according to the present invention is a temperature sensor device produced by using the production method. Here, "organic layered thin films" mean that more than or equal to at least 80% of the layered thin films are composed of organic materials with the exception of thermoelectric material which constitutes the thermopile even when the films are partly composed of inorganic materials for reinforcement or insulation layers.

A conventional thermopile used for an infrared sensor device is known wherein many thermocouples made of Bi and Sb as thermoelectric material are connected in series on an organic thin film as the aforementioned thin film, which is a PET film (polyethylene terephthalate film) about 5 μm in thickness. According to the present invention, layered thermopiles are laminated on the film like this made of mainly-organic-based materials.

As described previously, most organic materials like PET film can be formed as very thin film with very low heat conductivity, therefore preferably used for the light receiving part of an infrared sensor. And most organic materials have melting points lower than or equal to 300, and have softening point so that they can be connected with each other by thermal compression bonding. And it is easy to make a hole in the organic film or cut the film using a heated stick or blade made of metal or ceramic.

A temperature sensor device according to the present invention is a device wherein the multi-layered thin films are connected by adhesive agent to form the thin film in the form of one sheet.

When multi-layered thin films are made of organic materials, each layered thin film such as a PET thin film which constitutes multi-layered thin films are independently formed beforehand with each layered thermopiles accomplished thereon, and bonded with each other to form one sheet of multi-layered thin films, the films can be bonded by thermal fusion bonding without using adhesive agent. And also adhesion sheets in the form of very thin sheets (pre-made solid adhesion sheets) can be used as adhesive agent for the thermal fusion bonding. And also thin films can be bonded by heating under pressure after adhesive agent such as epoxy-based liquid adhesive agent less than or equal to 1 μm in thickness is coated thereon, and each layered thin film is aligned and placed on the other layered thin film. Adhesive agent which makes use of polymerization reaction of epoxy-based materials is preferable for the bonding of multi-layered thin films with large area because the evaporation of solvent is not necessary and only temperature and time for reaction are the critical factor.

Multi-layered thin films can be bonded using adhesive agent such as a solvent which solves organic or inorganic materials which constitute the films by solving a part of each materials. Among such a solvent, some solvents such as a solvent including hydrofluoric acid for silicon oxide solves the surface layer of the thin film while being diffused into the film at the same time. Solvents like this can be used for the bonding inorganic or organic multi-layered thin films.

A temperature sensor device according to the present invention is a device wherein interlayer connection between the layered thermopiles is electrically connected via through-holes of the corresponding layered thin films formed on electrodes of the layered thermopiles.

When the multi-layered thin films are bonded using adhesive agent, because electrodes formed on the upper layered thin film and on the lower layered thin film need to be connected electrically so that each layered thermopiles formed on each layered thin films are connected in series, adhesive agent needs to be placed with care so that the adhesive agent is coated on these electrode and not coated on the through-holes of the upper layered thin film while the through-holes of the upper layered thin film are placed at the positions corresponding to the electrodes of the lower layered thin film so as to ensure electrical connectivity.

In this way, it is preferable to electrically connect the electrodes of each layered thermopiles formed on upper and lower layered thin films via through-holes formed in the upper layered thin films. Then it is convenient that the electrodes of layered thermopiles on the upper layered thin films can be easily connected using conductive adhesive agent and so on when they are formed on the periphery of through-holes formed on the upper layered thin films.

A temperature sensor device according to the present invention is a device wherein a plurality of the temperature sensing parts are arranged on the substrate in the form of an array.

According to the present invention, a plurality of temperature sensing part can be formed on the same substrate, a plurality of outputs of each composite thermopile can be differentially amplified, or temperature distribution can be measured using the temperature sensing parts arranged in the form of an array. For example, when this device is used for an infrared sensor, it can be used for an image sensor or a detector of heat sources at several different locations. One junction (a cold junction or a hot junction) of each layered thermopile of the composite thermopile is formed on the same substrate with large heat capacity, which enables high-accuracy temperature measurement by a thermopile, which is a temperature difference sensor, because the reference temperatures of each temperature sensing parts become same.

For example, when the above-mentioned device with a plurality of temperature sensing part formed on the same substrate is used for the infrared sensor of an aural thermometer, the temperature of drum membrane which is higher than the temperature of auris externa can be measured as the highest temperature in the measured aural temperature distribution. In this way, the measurement error of body temperature due to the variation of insertion angle when a sensor is inserted into the ear can be minimized.

A temperature sensor device according to the present invention is a device wherein the temperature sensing parts are equipped with at least one thin film heater along with the thermopiles.

A composite thermopile formed on multi-layered thin films thermally isolated from a substrate is a highly-sensitive sensor. A heat conduction type sensor can be provided by forming the composite thermopile with a thin film heater on multi-layered thin films. A heat conduction type sensor is a sensor which detects a change in thermal conductivity of fluid such as gas, or liquid etc. which is in touch with a thin film heated by the thin film heater. It can be used for a flow sensor, an air pressure sensor (including a vacuum sensor), a gas sensor including a hydrogen sensor or a humidity sensor, and an extremely-compact thermal analyzer which detects a change in the enthalpy of material under test by scanning a micro heater. As the thin film heater, a thin film resistor body such as a metal body or a thin film thermocouple can be used. And also the thin film can be not only an inorganic thin film but also an organic thin film made of PET or vinyl chloride and so on, because a temperature rise of at most 10 is required for the heating temperature of a thin film heater (a micro heater). And also the use of the heat conduction type sensor is not limited to measure physical quantities by measuring a change in the temperature of multi-layered thin films corresponding to a change in the thermal conductivity of fluid in surrounding environment during heating by the thin film heater. In some cases, a change in the thermal conductivity of fluid in surrounding environment during cooling down period after the end of heating by the thin film heater is preferably measured.

A temperature sensor device according to the present invention is a device wherein an absolute temperature sensor device is formed on the substrate which is used as a sensor to detect temperature on the substrate.

A thermopile is a temperature difference sensor. So an absolute temperature sensor such as a platinum resistor body or a thermistor is necessary to measure an absolute temperature. In this case, it is preferable to measure the temperature of a substrate, which will be the reference temperature of each temperature sensing part of the thermopile, by an absolute temperature sensor. Therefore the device is a device wherein an absolute temperature sensor is formed on a substrate. When the substrate is made of semiconductor material, a diode formed on the substrate can be utilized as a temperature sensor. And also the material with large temperature coefficient of resistance value among the materials which constitute the thermopile can be used as a resistance temperature sensor.

A temperature sensor device according to the present invention is a device as an infrared sensor wherein the temperature sensing parts functions as an infrared light receiving part and the device is used for an infrared sensor.

According to the present invention, a plurality of thin films in the infrared receiving part as temperature sensing parts are laminated, then a thermopile (a composite thermopile) with a three-dimensional thermocouple array can be fabricated. Therefore, as mentioned above, an infrared sensor device with very small internal resistance can be materialized for the total number of thermocouples thereon on an isometric infrared receiving part. Generally speaking, the internal resistance of a sensor is dominated by Johnson noise. Therefore, the internal resistance of a sensor must be small by any means to obtain a sensor with high S/N ratio. A special absorption film such as gold black and so on can be formed at a light receiving part as an infrared absorption film. But if the absorption band of multi-layered thin films is in the desired infrared part of the spectrum, such a special absorption film need not be formed for these multi-layered films can be utilized.

In order to utilize a temperature sensor device according to the present invention as an infrared sensor device, an infrared absorption film having an absorption band in the desired infrared part of the spectrum needs to be formed in the device. When the infrared sensor device is used for an aural thermometer, absorption films having an absorption band from 8 to 14 µm in wavelength corresponding to an infrared part of the spectrum at 37° C. which is human body temperature are preferably used. If the aforementioned multi-layered thin film itself has the absorption band, the multi-layered thin film can be used as the absorption film. However, in some cases, an infrared absorption film is often formed separately from the multi-layered thin film in consideration for the thickness of the film.

Gold black is often used for an infrared absorption film, and porous Cr or Ni thin film is also used for it. The function of an infrared absorption film is to receive infrared light, convert it into heat, and increase the temperature of a thin film in the region including a contact point of the light receiving part of a thermopile. There is an upper limit on the number of thermocouples in a layered thermopile formed on each layered thin film. Therefore, ideally it is desired to form contact points of thermocouples which constitute a layered thermopile near the center of the thin film of a light receiving part, in practice, each contact points of a thermocouple array have to be formed at a position out of the center of the thin film in consideration of the relationship between the area of each contact point and the number of thermocouples. Generally, an infrared absorption film is formed on all over the thin film which is a light receiving part. Then, the center of the thin film will be heated at the highest temperature by receiving infrared light. An infrared sensor device with high sensitivity can be materialized by forming and extending a thermal conduction thin film until a contact point of the thermocouple array of a layered thermopile formed in the region of a thin film thermally separated from a substrate, including near the center of the part, among each layered thin films. In addition, it is sufficient for an infrared absorption film to be formed on the multi-layered thin film. It is not necessary to be formed on each layered thin film.

A temperature sensor device according to the present invention is a device wherein a plurality of temperature sensing parts are formed on a light receiving part as an infrared sensor, which are thermally isolated from the substrate and composed of the thin films which are thermally isolated from each other.

The device is preferably configured for the measurement of the temperature distribution of the object under test or the temperature difference in the measurement region. And it has an advantage that the device can be smaller than the device with a plurality of light receiving parts.

A radiation thermometer according to the present invention is a thermometer characterized in that it receives infrared light emitted from an object to display the temperature or the temperature distribution of the object based on the signals from the temperature sensor device.

Here, the temperature sensor device of the present invention is used as an infrared sensor device and applied to a radiation thermometer. The device can measure the temperature of the object under test. And also it can be used as an image sensor to measure the temperature distribution and visualize its image. And also it can be used as an aural thermometer to measure tympanic temperature and display body temperature. And because the device can be arranged with high sensitivity, then application to a gas sensor is expected using the infrared absorption behavior of specific gases such as carbon dioxide.

To achieve the aforementioned object, a multi-layered thin film thermopile according to the present invention is characterized in that a multi-layered thin film, thermally isolated from a substrate by a cavity, is composed of layered thin films, and in that layered thermopiles are formed on the layered thin films, and in that the layered thermopiles on the upper film is connected in series with the layered thermopiles on the lower film via through-holes formed on the layered thin films, and in that at least one composite thermopile is formed thereon, and in that the layered thin films which constitute the multi-layered thin film are mainly made of photo-resist film, and in that the through-holes are formed by exposure and development on the photo-resist film, and in that the multi-layered thin film is reinforced by a reinforcement film, made of different material from that of the multi-layered thin film, is formed in close contact with the multi-layered thin film.

In this specification, a thermopile which is formed on each layered thin film which constitute a multi-layered thin film thermally isolated from the substrate is called as 'a layered thermopile'. And these layered thermopiles electrically connected in series are called as 'a composite thermopile'.

The multi-layered thin film can be fabricated accurately and easily with a shape, thickness, and size as designed owing to the use of photolithography because the multi-layered thin film is mainly made of photo-resist film. And through-holes can be formed accurately and easily at the desired position on the photo-resist film, which works as the layered thin film, determined by the resist pattern after photolithography and development process, so that layered thermopiles on the upper and lower film can be easily connected. This photolithography is applied not only the pattern of thermoelectric material of thermopiles but also the pattern of a cavity and the cutting pattern of sensor chip from the substrate, therefore reproducible device size and sensor characteristics. Generally speaking, a thin film of photo-resist has electric insulating property and low thermal conductivity for it is organic material. A composite thermopile according to the present invention is formed by laminating layered thin films made of this photo-resist film to form a multi-layered thin film, and connecting layered thermopiles formed on each layered thin film in series via through-holes.

A thermocouple which constitutes a layered thermopile has a cold junction and a hot junction. For example, when a thermocouple is used for an infrared sensor which receives infrared light, generally, a cold junction is a junction formed on a substrate with large heat capacity, and a hot junction is a junction formed on a thin film thermally isolated from the substrate if received infrared light is emitted from an object with higher temperature than the temperature of the substrate. However, if received infrared light is emitted from an object with lower temperature than the temperature of the substrate, heat dissipation from a thin film of a light receiving part increases to cool the thin film, then a hot junction is a junction formed on the substrate, and a cold junction is a junction formed on the thin film. A substrate is used as a heat sink because it has larger heat capacity than a thin film as a light receiving part, and the temperature of the substrate is used as a reference temperature.

When a composite thermopile with a multi-layered thin film is formed on an isometric temperature sensing part, the number of thermocouples can be increased for the number of lamination with low internal resistance, compared with a thermopile formed on one-layered thin film, therefore large output voltage can be obtained from the thermopile according to the increase of thermocouples. Accordingly, a multi-layered thin film thermopile with high sensitivity can be provided.

Via through-holes formed on a layered thin film made mostly of photo-resist films, each upper and lower layered thermopiles are electrically connected in series. In such a case, it is preferable to place through-holes formed on the layered thin film at the different position from through-holes formed on a layered thin film just below. From this viewpoint, it is important to design the pattern of a layered thermopile so that the positions of through-holes are different from each other, and each layered thermopiles are connected in series as a whole to form a composite thermopile.

Thermocouples which constitute each layered thermopile can be connected in series, in parallel, or in the combination of these. Especially, all the thermocouples are preferably connected simply in series in order to increase the thermoelectric force of a composite thermopile with two terminals under a given temperature difference $\Delta T$.

Photo-resist film which is used for a multi-layered thin film is generally thin and elastic organic material. Therefore, it is liable to suffer a deformation or a deflection in a process of bridge formation. To solve this problem, a hard material for reinforcement which is different from that of the multi-layered thin film, for example, an inorganic material such as a silicon thin film, an aluminum thin film, or a silicon nitride thin film, and so on, is formed by sputtering deposition, and the strength of a multi-layered thin film with a floating structure due to a cavity can be enhanced. When an SOI (Silicon on Insulator) layer is used for the substrate, the SOI layer can be used for the thin film for reinforcement. A multi-layered thin film made of a photo-resist film is formed on the SOI layer, and a composite thermopile can be formed thereon. A cavity is formed without removing the SOI layer, and the cavity can be filled with sacrifice material such as zinc. A SOI layer is heat-resistant up to a high temperature. Therefore, a thin film heater can be formed thereon. And a diode or a transistor can be formed for use in an absolute temperature sensor or a thin film heater. And an integrated circuit can be formed thereon.

A production method of a multi-layered thin film thermopile according to the present invention is a production method of a multi-layered thin film thermopile comprising:

sacrifice region fabrication process forming a sacrifice region wherein a cavity is formed with a given size on a substrate, and is filled with sacrifice material;

photo-resist coating process coating a photo-resist film which covers the sacrifice region and the substrate;

pattern forming process forming photo-resist patterns by exposing a photo-resist film;

layered thermopile fabrication process forming a layered thermopile;

repeating process repeating a sequence of the above described process steps from the photo-resist coating process to the layered thermopile fabrication process to form a multi-layered thin film;

and sacrifice region removing process subsequently removing the sacrifice region.

The sacrifice region fabrication process is generally performed by filling sacrifice material in a cavity, such as a cavity surrounded by exposed silicon planes, or a cavity covered by a film such as a thermal silicon oxide film, pre-fabricated with a given size by anisotropic etching, for example, on a substrate such as a single crystal silicon substrate, by known plating technology such as non-electrolytic nickel plating, copper plating, zinc plating, or the combination of these. The surface where the sacrifice region is formed after this process step has often a bulge. To remove this bulge, it is preferably to planarize the surface by physical polishing in the sacrifice region. And, if necessary, it is preferable to form concavities and convexities (concavities, convexities, or both of these) by photo-lithography. And furthermore, it is preferable to form trenches in the multi-layered film made of photo-resist subsequently coated so that the bending strength of the film is enforced. It is important to form the film with a thickness being increased along the effective bending direction. Concavities and convexities are preferably formed in the region wherein layered thermopiles of the multi-layered film are not formed to a maximum extent in order to prevent disconnection of the layered thermopiles. Thereafter the process steps are performed comprising:

photo-resist coating process coating a photo-resist film which covers the sacrifice region and the substrate;

pattern forming process forming through-holes after determining layered thin film regions;

layered thermopile fabrication process;

repeating process repeating a sequence of the above described process steps to laminate layered thermopiles to form a composite thermopile. Needless to say, in these process steps, layered thermopiles, each of them are formed on the upper and lower layer, are electrically connected in series via through-holes formed in the layered thin film, then at least one composite thermopile is formed and the patterns of output terminals are formed in the substrate region. Thereafter the sacrifice region removing process is performed by making an etchant penetrate into the sacrifice region through etching holes which are pre-formed on a multi-layered film made of photo-resist on a cavity formed on the surface of the substrate or in a cavity placed in the backside of the substrate. Then the production of a multi-layered thin film thermopile will complete after the process steps such as wire-bonding from output electrode pads or packaging.

A multi-layered thin film thermopile according to the present invention is characterized in that a multi-layered thin film, thermally isolated from a substrate by a cavity, is composed of layered thin films, and in that layered thermopiles are formed on the layered thin films, and in that the layered thermopiles on the upper film is connected in series with the layered thermopiles on the lower film via through-holes formed on the layered thin films, and in that the layered thin films which constitute the multi-layered thin film are mainly made of photo-resist film in multi-layered thin film thermopiles which constitute at least one composite thermopile, and in that the through-holes are formed by exposure and development on the photo-resist film, and in that the multi-layered thin films are formed on the sacrifice region, and in that the films are thermally isolated from the substrate by the cavity which is formed by removing the sacrifice region, and in that the sacrifice region is formed by filling with sacrifice material in the cavity which is formed with a given size on the substrate.

A sacrifice region is generally called as a sacrifice layer when it is in the form of laminate. But, it's not always the case in the present invention. So it's called as a sacrifice region. And also material of the sacrifice region is called as sacrifice material. A sacrifice region is fabricated using an etching solution (an etchant) which does not solve a photo-resist film but solves sacrifice material, the photo-resist being main material of a multi-layered thin film. For example, when a sacrifice material is copper, ferric chloride solution can be used as an etching solution. A sacrifice region can be formed, for example, by electrolytic plating or non-electrolytic plating of Ni, Zn, Cu, and so on. And also a sacrifice region can be formed by filling the cavity with sacrifice material with low melting temperature such as Zn etc. which is heated and solved. And also a sacrifice region can be formed by filling the cavity by soaking a substrate with a cavity in a melted zinc plating tank. In that case, the exposed area of a cavity having a silicon crystal plane surrounded by a (111) plane can be easily formed by anisotropic etching using hydrazine and so on, because a thermal oxide film of single crystal silicon and so on is used as an etching mask. This exposed area is plated by non-electrolytic plating of Ni. Then, this area is soaked in a melted zinc plating tank including material with flux being readily-etched with low melting temperature in order to improve the wettability between non-electrolytic Ni plating plane and zinc, and to fill the cavity with zinc. All the area except the silicon cavity is covered by silicon oxide film during the non-electrolytic Ni plating process. So it is convenient that zinc which is sacrifice material remains on only the non-electrolytic Ni plating plane. And, for example, dilute hydrochloric acid can be used as an etching solution. Also, the electrode of a composite thermopile is often exposed. Then it is necessary to select electrode material which resists against these etching solutions. Needless to say, the material for the electrodes of a thermopile can be arbitrarily selected when the electrodes are covered and protected using photo-resist of other type whose developing solution does not solve the photo-resist which constitutes a multi-layered thin film.

A pre-fabricated cavity with a given size on a substrate of silicon single crystal is filled with, for example, metal such as zinc for sacrifice material, then photo-resist film with a given thickness is spin-coated for a multi-layered thin film thermopile thereon. A film of two different thermoelectric materials for a layered thermopile (for example, Sb and Bi) is formed by sputtering, for example. Then, on the film, patterns are formed to fabricate a layered thermopile by photolithography using photo-resist which is different from the photo-resist for the multi-layered thin film. Then, a photo-resist film for a multi-layered thin film is spin-coated again with a given thickness, and through-holes for electrical conduction between the upper and lower layers or etching holes for etching the sacrifice region are formed by exposure and development process for the photo-resist film. Then, the sputtering deposition process or the fabrication process of a layered thermopile is repeated to form a composite thermopile. Then, the sacrifice region is removed by etching solution through the etching holes on the sacrifice region. By this process, the pre-fabricated cavity appears and a multi-layered thin film for a composite thermopile is thermally isolated from the substrate. Then, wirings to electrode pads are formed and the composite thermopile is completed.

A multi-layered thin film thermopile according to the present invention is a device wherein the substrate is made of single crystal silicon.

Single-crystal silicon is preferable material for the substrate of a multi-layered thin film thermopile, because a cavity with high dimensional accuracy can be formed by anisotropic etching utilizing its crystal plane, and an electronic component such as a diode or a transistor or an IC can be formed on the substrate, and an insulating film can be easily formed, and it is a material with high heat resistance and high durability.

A multi-layered thin film thermopile according to the present invention is a device wherein the thickness of the multi-layered thin film is effectively increased in a reflection of concavities and convexities formed on the sacrifice region, and the bending strength of the multi-layered thin film is enhanced.

In the present invention, the thickness of the multi-layered thin film is effectively increased to enhance the bending strength of the multi-layered thin film, one or more trenches are formed by, for example, etching technology using photolithography on the sacrifice region made of zinc, and a multi-layered thin film for the multi-layered thin film thermopile is formed by coating a photo-resist film thereon. Processed in this way, a concave as a cross-sectional shape is formed on the photo-resist film in a reflection of the trenches. And on the same principle that, so to speak, the bending strength of a corrugated tin plate is enhanced, the thickness of the photo-resist film is effectively increased along the bending direction, and the bending strength is enhanced. A multi-layered thin film can not only be made of photo-resist film but also be reinforced by forming other thin films. Generally, a bending strength is proportionate to the cube of a thickness, so the bending strength becomes eight times stronger when the effective thickness becomes two times larger. Here, a term "concavities and convexities formed on the sacrifice region" means one of concavities and convexities or both, and it is simply expressed as "concavities and convexities".

A multi-layered thin film thermopile according to the present invention is a device wherein a plurality of composite thermopiles are placed in the form of an array on the substrate.

By placing a plurality of composite thermopiles in the form of an array on the same substrate, one thermopile can be used for the measurement of the temperature of a target object and the other can be used for the measurement of a specific temperature which is used as a reference temperature, for example, when two composite thermopiles function independently. And also a number of composite thermopiles can be placed in the form of two-dimensional array, each of them being used as a pixel of an image sensor. For example, when the composite thermopiles are used for infrared sensors of an aural thermometer, the temperature distribution of an ear can be measured wherein the temperature of an outer ear is lower than that of a drum membrane. Then the temperature of a drum membrane can be measured as the highest temperature in the temperature distribution. In this way, the measurement error of a thermometer due to the difference of its insertion angle into the ear can be minimized. Needless to say, there are many other applications, such as a gas flow sensor or a liquid flow sensor by the combination of a heater formed on the substrate and the thermopiles located upstream and downstream of the heater.

A composite thermopile which is formed on a multi-layered thin film thermally isolated from a substrate is highly sensitive. And a thermal conduction type sensor can be provided by forming this composite thermopile and a thin film heater on the multi-layered thin film. A thermal conduction type sensor is a device to detect a change in a thermal conduction ratio of fluid such as gas or liquid in contact with the thin film by heating the film using a thin film heater. It can be used for a flow sensor, a atmospheric pressure sensor including a vacuum sensor, a gas sensor including a hydrogen sensor or a moisture sensor, an extremely-compact thermal analyzer to detect a change in enthalpy of material by thermally scanning a thin film heater, and so on. For the thin film heater, a thin film resistor such as metal resistor or a thin film thermocouple can be used. And also a heat temperature of a thin film heater (a microheater) is mostly a temperature rise of about 10 deg C., therefore a photo-resist film can be used for the multi-layered thin film. And also the function as a thermal conduction type sensor is not limited to the measurement of several physical quantities by measuring the temperature change of a multi-layered thin film based on a change in the thermal conductivity of fluid in ambient environment. It is sometimes more desirable to measure a change in the thermal conductivity of the fluid during a cooling process immediately after the end of heating by the thin film heater in terms of heating noise elimination and an identification of fluid.

A multi-layered thin film thermopile according to the present invention is a device wherein an absolute temperature sensor is formed on the substrate, and is used as a sensor to measure the temperature of the substrate.

A thermopile is a temperature difference sensor, so an absolute temperature sensor is often necessary to indicate an absolute temperature. Especially, one of the junctions such as a cold junction of a multi-layered thin film thermopile is preferably formed on a substrate with large heat capacity and large heat conductivity. Especially when a thermopile is used for a radiation thermometer, it is necessary to know a reference temperature of the thermopile, therefore an absolute temperature sensor is necessary. As an absolute temperature sensor, a temperature-sensitive resistor thin film such as a platinum resistor, a thermistor, and a diode and a transistor are preferably used. If a single crystal silicon substrate is used, then a diode or a transistor can be formed directly on the substrate, and a temperature-sensitive resistor thin film or a thermistor can be formed on a silicon oxide film formed on the substrate. And also some resistors made of thermoelectric materials with larger temperature coefficient of resistance among the resistors which constitute the thermopile can be used as a temperature sensor. As described above, one of the junctions such as a cold junction of a multi-layered thin film thermopile is preferably formed on a substrate. In this case, other junction such as a hot junction is formed in a multi-layered thin film thermally isolated from the substrate. Therefore, according to the nature of a thermopile, when the temperature of the multi-layered thin film thermally isolated from the substrate is lower than the temperature of the substrate, a cold junction is a junction formed in this film, and a hot junction is a junction formed on the substrate.

A multi-layered thin film thermopile according to the present invention is a device wherein a semiconductor substrate is used and an integrated circuit including an amplifier is formed on the substrate.

When a semiconductor such as a silicon single crystal is used for the substrate, and a cavity is formed on the substrate, then a plurality of circuits such as an amplifier, an arithmetic circuit, and further, a driver circuit, and so on, can be formed on the same substrate. And also compact devices such as a radiation thermometer, an image sensor, a flow sensor, and so on, can be provided by forming a system on the same substrate using this IC technology.

A multi-layered thin film thermopile according to the present invention is a device wherein one of the junctions of the composite thermopile is formed in an infrared receiving part and the device is used for a thermal infrared sensor device.

One of the junctions of the composite thermopile such as a hot junction is formed on the thin film of an infrared receiving part as a temperature sensing part according to the present invention, then a plurality of the films are laminated to form a composite thermopile with a three-dimensional array of thermocouples. This materializes an infrared sensor device made of a multi-layered thermopile with very low internal resistance with respect to the total number of thermocouples formed on an isometric infrared receiving part. And also each layered thin film which constitutes the multi-layered thin film is formed by using photo-resist films, therefore very small through-holes can be formed with high accuracy. A temperature sensing part which is an infrared receiving part is a multi-layered thin film placed in a region thermally isolated from the substrate. And also a specific absorption film such as gold black can be formed in the light receiving part as an infrared absorption film. But when the multi-layered thin film has a desired absorption band at infrared wavelength range, then it is not necessary to form a specific absorption film such as gold black by using this multi-layered thin film.

A radiation thermometer according to the present invention is a device wherein, using the multi-layered thin film thermopile of the present invention, the temperature and the temperature distribution of an object can be displayed based on output signals from the multi-layered thin film thermopile, generated by receiving an infrared light from the object.

And also a multi-layered thin film thermopile according to the present invention can be applied for a radiation thermometer to measure the temperature of an object under measurement and for an image sensor to visualize the temperature distribution and its image. And also the thermopile can be applied for an aural thermometer to display body temperature by the measurement of drum membrane temperature. And also the thermopile can be applied for a non-dispersive infrared analyzer (anon-dispersive infrared gas analyzer) utilizing its high sensitivity. The thermopile with an infrared light source is a promising approach for a gas sensor utilizing infrared absorption of specific gas such as carbon dioxide.

In order to use the thermopile as a radiation thermometer, an infrared absorption film needs to be formed which has an absorption band in the desired infrared light wavelength range on the thermopile. For example, in order to use an infrared sensor device for an aural thermometer, the above mentioned multi-layered thin film itself can be made of a silicon nitride film or a silicon oxide film, because a silicon nitride film and a silicon oxide film have an absorption band in the vicinity of 8-14 µm which corresponds to 37 degrees C. which is a human body temperature. The multi-layered film itself can be made of a photo-resist film having the absorption band. However there is a problem whether an appropriate thickness of the film can be determined or not. Therefore in many cases, a separate infrared light absorption film is preferably formed.

Gold black film is often used for an infrared light absorption film, and a porous chrome thin film and Ni thin film are also used. The function of an infrared light absorption film is to receive infrared light, to convert received light into heat, and to increase or decrease the temperature of a thin film in the region where the junction of the thermopile is placed in the light receiving part. There are some limitations to the number of thermocouples in a layered thermopile formed on each layered thin film. Therefore the junction of a thermocouple array which constitutes a layered thermopile and is desired to be formed in the vicinity of the center region of the thin film in the light receiving part has to be formed at a position out of the center of the thin film in consideration of the relationship between the area of each contact point and the number of thermocouples. Generally an infrared light absorption film is formed all over the surface of the thin film which is a light receiving part and the center region of the thin film is the region which is heated at the highest temperature by receiving infrared light. An infrared sensor device with high sensitivity can be provided by forming a heat conductive thin film which conducts high-temperature heat of the center region so that the film covers as far as junctions of the thermocouple array of a layered thermopile formed on thin films which are thermally isolated from the substrate among each layered thin films, including the vicinity of the center region. In addition, an infrared light receiving film can be formed in a multi-layered thin film. It is not necessary to be formed on each layered thin film.

In the radiation thermometer according to the present invention, infrared light from a target object is absorbed in the light receiving part which is a temperature sensing part, and is converted into heat using a multi-layered thin film thermopile, then the temperature and the temperature distribution of the object are displayed based on the output electric signal of the multi-layered thin film thermopile caused by the temperature change. The temperature of the target object can be measured and visualized as the temperature distribution or its image by using the thermometer as an image sensor. And also body temperature can be displayed by the measurement of the drum membrane temperature by using the device as an aural thermometer. And an application for a gas sensor can be expected utilizing an infrared absorption of specific gas such as carbon dioxide gas because the device has high sensitivity. A compact radiation thermometer according to the present invention can be provided when an integrated circuit is formed on a single crystal silicon substrate which is also used for a sensor chip for the multi-layered thin film thermopile.

Effect of the Invention

The First Invention

A composite thermopile is formed by laminating k layered thin films with thermopiles while the isometric thin films are placed in the temperature sensing part in a temperature sensing device according to the present invention. This provides an advantage that the internal resistance becomes smaller in proportion to one squared $k^{th}$ part of that of the conventional thermopile formed on one layered thin film, and a temperature sensor device with large S/N ration can be obtained which has thermocouples with the same total number n as the conventional one.

A temperature sensor device according to the present invention can be used as one sheet of temperature sensing part by laminating a plurality of thin films made of organic material wherein layered thermopiles are formed. And also a thermopile can be highly sensitive because larger output can be obtained when it is composed of more thermocouples for the same temperature difference ΔT between junctions. This provides an advantage that a temperature sensor device with high sensitivity and relatively low resistance can be provided by three dimensional expansion of a composite thermopile having totally n thermocouples by lamination.

A production method of a temperature sensor device according to the present invention comprises process steps including multi-layered thin film bonding process overlapping and bonding each layered thin films to form a composite thermopile as a multi-layered thin film after each layered film is aligned and placed on the other layered thin film and layered thermopile fabrication process forming a layered thermopiles on each thin films mostly made of organic thin films and to laminate the films, having advantages that an organic thin film with low thermal conductivity such as a PET film which can be formed as a very thin film can be utilized, and that through-holes can be easily formed, and devices can be easily isolated, and that a low price temperature sensor device with high sensitivity and high S/N ratio can be easily provided.

It is preferable to form electrodes of layered thermopiles on the upper layered thin film around through-holes formed on the upper layered thin film (a structure wherein through-holes are formed in electrodes on the layered thermopiles) in the temperature sensor device according to the present invention so that interlayer electrical conduction can be easily obtained by using conductive adhesive agent and so on.

Temperature sensing with high accuracy can be provided in the temperature device according to the present invention because all of the cold junctions or hot junctions of each layered thermopiles of a composite thermopile are formed on the same substrate with high heat capacity and the reference temperatures of each thermopiles became same which are temperature difference sensors.

In a temperature sensor device according to the present invention, at least one thin film heater (a micro-heater) can be formed on the multi-layered thin film wherein a composite thermopile is formed. Such a configuration provides an advantage that physical quantities can be measured with high sensitivity and high accuracy such as fluid flow, impurity concentration, atmospheric pressure and various thermal physical quantities measured by heat analysis by applying it for a thermal conduction type sensor.

In a temperature sensor device according to the present invention, a configuration wherein a plurality of temperature sensing parts are formed on the same substrate provides an advantage that the outputs of each composite thermopiles can be used as the inputs of a differential amplifier, or they are formed in the form of an array so that a temperature distribution can be measured so as to extract the highest or lowest temperature in the measured area.

The temperature sensor device according to the present invention can be used as thermal type infrared sensor, so a thermometer or an image sensor with high sensitivity as a radiation temperature can be easily provided.

The Second Invention

The second invention has the effects as described next in addition to the effects of the first invention.

The multi-layered thin film thermopile according to the present invention offers an advantage that the temperature sensing part which is a floating thin film thermally isolated from the substrate via a cavity in the multi-layered thin film of a photo-resist film can be reinforced to resist deformation by the selection of the photo-resist material and under the support of a thin film for reinforcement.

The production method of the multi-layered thin film thermopile according to the present invention comprises necessary process steps to form layered thermopiles on each layered thin film mostly made of a photo-resist film and to laminate the layered thin films. The photo-resist film is mostly made of organic material with very low heat conductivity and it can be easily formed as a very thin film, and through-holes can be easily formed with high accuracy. Therefore a multi-layered thin film thermally isolated from a substrate used for a temperature sensing part can be easily formed by using a sacrifice region utilizing a cavity pre-formed with high accuracy. Therefore the production method according to the present invention offers an advantage that a very uniform sensor device can be formed with small variability, high sensitivity, and quick response, device isolation can be easily made, and a low price multi-layered thin film thermopile with high S/N ratio can be provided. Especially when a inexpensive silicon single crystal substrate is used as substitute for SOI substrate, it offers an advantage that a compact low price multi-layered thin film thermopile having an integrated circuit can be provided.

The multi-layered thin film thermopile according to the second invention, where each layered thin films which constitute the multi-layered thin film thermally isolated from the substrate by a photo-resist film are mostly made of a photo-resist film, provides advantages that minute through-holes can be easily formed with high accuracy by patterning based on exposure and development process of the photo-resist film itself, and each layered thermopiles can be easily connected in series via the through-holes, and furthermore the number of the process steps can be reduced to form the multi-layered thin film by using a photo-resist film which can be directly patterned by the exposure and development process.

In the multi-layered thin film thermopile according to the present invention, a sacrifice region can be formed by filling sacrifice material in the cavity of accurate size which is pre-formed on the substrate, so it is easy to thermally separate a composite thermopile from the substrate by removing the sacrifice region by etching process. Even when a silicon substrate is used and a cavity is formed on the substrate by using anisotropic etchant which is strongly-alkaline etchant, it is not necessary to use the strongly-alkaline etchant to etch the sacrifice region in order to thermally separate the multi-layered thin film made of photo-resist film from the substrate. This provides an advantage that there is a wide range of options to select the combination of sacrifice material and its etchant.

In the multi-layered thin film thermopile according to the present invention, a crystalline substrate such as silicon single crystal can be used. Then a cavity of accurate size can be easily formed utilizing crystal orientation plane. Therefore the size of the region which is thermally isolated from the substrate of multi-layered thin film is determined very accurately according to the size of the cavity. This offers an advantage that a multi-layered thin film thermopile can be provided having very accurate and uniform thermal response.

In the multi-layered thin film thermopile according to the present invention, the bending strength of the multi-layered thin film can be easily increased by effectively increasing the thickness of the multi-layered thin film in a reflection of concavity and convexity formed on the sacrifice region.

In the multi-layered thin film thermopile according to the present invention, utilizing the sacrifice region formed on the substrate, a temperature sensing part can be formed which is a floating thin film thermally isolated from the substrate of the multi-layered thin film of the photo-resist film, and circuits such as integrated circuits can be formed in a substrate region under the floating temperature sensing part. In this way, a compact multi-layered thin film thermopile can be provided which can be used as a system. Especially when a two-dimensional infrared sensor light receiving part array is formed utilizing this floating temperature sensing part as micro-pixels of an image sensor, an integrated circuit as a signal processing circuit of each pixel is preferably formed in a substrate region under the floating temperature sensing part. This configuration enables infrared light receiving with effectively large light receiving area so as to provide an image sensor with excellent resolution and high sensitivity.

In the multi-layered thin film thermopile according to the present invention, a crystalline substrate such as silicon single crystal can be used, which makes it possible to utilize matured IC technology. The thermopile offers an advantage that a compact multi-layered thin layer thermopile with high sensitivity and a radiation thermometer using this can be provided because integrated circuits such as an amplifier, an operational circuit, a control circuit, and so on, or a system if necessary can be formed on the substrate of a conventional multi-layered thin film thermopile.

Hitherto an expensive SOI substrate has been used for a substrate for a thermopile. But the multi-layered thin film thermopile according to the present invention can offer an advantage that a low-price multi-layered thin film thermopile can be provided by using simply inexpensive silicon single crystal.

In the multi-layered thin film thermopile according to the present invention, one junction (a cold junction or a hot junction) of each layered thermopile of the composite thermopile is formed on the same substrate with large heat capacity, which enables to provide very accurate temperature sensing because the reference temperatures of each temperature sensing part of the thermopiles become equal which is a temperature difference sensor.

The multi-layered thin film thermopile according to the present invention provides an advantage that physical quantities can be measured with high sensitivity and high accuracy such as fluid flow, impurity concentration, atmospheric pressure and various thermal physical quantities measured by heat analysis by applying it for a thermal conduction type sensor because at least one thin film heater (a micro-heater) other than a composite thermopile can be formed on the multi-layered thin film or a different multi-layered thin film placed close to the film, the film where the composite thermopile is formed.

In the multi-layered thin film thermopile according to the present invention, a plurality of temperature sensing parts can be formed on the same substrate, and each output of the composite thermopiles can be differentially amplified, or temperature distribution can be measured using the temperature sensing parts arranged in the form of an array. Utilizing this device, the highest temperature or the lowest temperature can be extracted, so the device can be applied for an aural thermometer, and the temperature of auris externa can be measured with small measurement error.

BRIEF DESCRIPTION OF THE DRAWING

FIG. 7(*a*) shows a plane view of the structure pasted on a frame. FIG. 7(*b*) shows a cross-sectional outline diagram of the structure along X-X line (embodiment 3 of the first invention).

FIG. 9(*a*) is a plane view of the structure, and FIG. 9(*b*) is a cross-sectional outline diagram along nearly X-X line, wherein actual pin electrodes are not placed on the X-X line, but they are, for convenience, shown as placed on the line to show their cross-sectional shape (embodiment 3 of the first invention).

FIG. 19(*b*) is a cross-sectional outline diagram along the line Y-Y, wherein concavity and convexity 9 are formed (only concave portion is shown in this diagram), and bending strength is enforced by increasing the effective thickness of a multi-layered thin film 15 made of photo-resist film formed thereon (embodiment 8 of the second invention).

DESCRIPTION OF THE SYMBOLS

Figure 1:
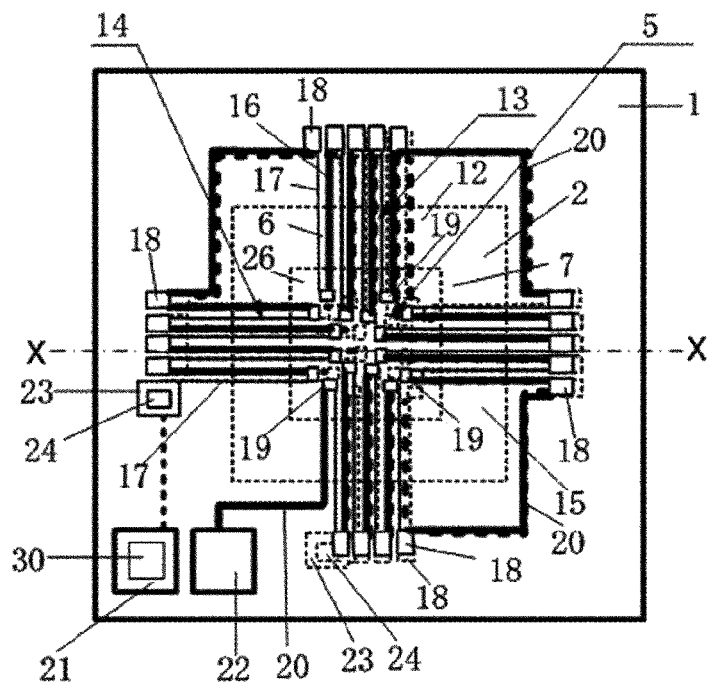
FIG. 1 is a plane view of an outline diagram to show an embodiment to explain the concept of a temperature sensor device according to the present invention applied for a thermal infrared sensor device (embodiment 1 of the first invention).

1: substrate
2, 2A, 2B: thin film
3: thermopile
5, 5A, 5B: temperature sensing part
6: thermocouple
7: light receiving part
8: sacrifice region
9: convex and concave
10: cavity
11: through-hall
12, 12A, 12B, 12C: layered thin film
13, 13A, 13B, 13C: layered thermopile
14, 14A, 14B: composite thermopile
15, 15A, 15B: multi-layered thin film
16: thermoelectric conversion body A
17: thermoelectric conversion body B
18: contact point A
19: contact point B
20: interconnection
21, 21A, 21B: electrode terminal A
22, 22A, 22B: electrode terminal B
23: electrode
24: connection part between upper thin film and lower thin
film
25: infrared absorption film 26: thermal conductive thin film
27: adhesive agent
28: insulating layer
29: electrically-conductive material
30: contact hole
31, 31A, 31B, 31C: frame
32: pin electrode
33: external electrode terminal
34: absolute temperature sensor
35: thin film heater
36: slit
41: array substrate
42: array substrate connection part
50: infrared sensor device
55: radiation thermometer
60: subject under temperature measurement
65: heater electrode
70: lens system (light receiving array)
91: plating film
100: reinforcing thin film
110: integrated circuit
121: vertical scanning circuit
122: horizontal scanning circuit
140: composite thermopile array

BEST MODE FOR CARRYING OUT THE INVENTION

Several embodiments of a temperature sensor device according to the present invention are described in detail as follows with reference to drawings.

Preferred Embodiment 1

Figure 2:
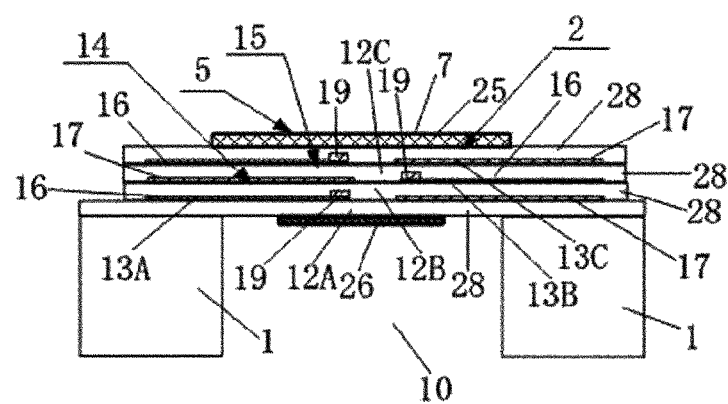
FIG. 2 is a cross-sectional outline diagram along X-X line of the temperature sensor device according to the first invention shown in FIG. 1 (embodiment 1 of the first invention).

FIG. 1 is a plane view of an outline diagram to show an embodiment to explain the concept of a temperature sensor device according to the present invention applied for a thermal infrared sensor device, and FIG. 2 is a cross-sectional outline diagram along X-X line of the device shown in FIG. 1. FIG. 1 is a diagram when the device is applied for a thermal infrared sensor device. An infrared absorption film 25 and a thermal conduction thin film 26 formed on the light receiving part 7 are omitted in an easy-to-understand manner in the diagram. And also a thin film 2 is formed as a membrane (a diaphragm) on the substrate 1, being thermally isolated from the substrate by a cavity 10. A thermopile 3 is formed on the thin film 2. This thin film 2 is a multi-layered thin film 15 in the present invention and layered thermopiles 13 (13A, 13B, and 13C) are formed on each layered thin films 12 (12A, 12B, and 12C) which constitute this multi-layered thin film 15. The upper and lower layered thermopiles 13 which are laminated by adhesive agent 27 or thermal fusion bonding are connected in series via conductive parts 24 of the upper and lower thin films and the output of the device is provided at an electrode terminal A21 and B22 to external circuits so as to increase the thermal electromotive force of the device. In addition, a junction A18 of each layered thermopile 13 is placed on the substrate 1 with large heat capacity which works as a heat-sink, and the other junction B19 is placed near the center of the diaphragm which works as a light receiving part 7. The center portion of the diaphragm is small in area. So in practice, a heat conductive thin film 26 is formed on the region including the center of the diaphragm and a junction B19 is formed thereon, the thin film 26 made of a metal thin film or heat conduction body to transfer heat of temperature rise caused by infrared light received from a hot body at near the center of the diaphragm from the center portion to the surrounding portion, and vice versa when infrared light received from a cold body.

When a temperature sensor device according to the present invention is applied for a thermal infrared sensor device, the device is formed with a structure wherein an infrared receiving part 7 is formed, and a multi-layered thin film 15 is thermally isolated from the substrate 1 by the cavity 10, the thin film 15 connected with each layered thin films 12 (12A, 12B, and 12C) where each layered thermopiles 13 (13A, 13B, and 13C) are formed. These each layered thin films 12 can be made of inorganic materials such as silicon dioxide films, silicon nitride films, or the combination of these, or organic materials such as plastic thin films such as PET films. And also each layered thermopiles 13 (13A, 13B, and 13C) is comprised of thermocouples 6 made of a plurality of thin films connected in series. They can be formed as thermocouples 6 made either of inorganic or organic thermoelectric materials. Generally, thermocouples 6 are made of thin films of the combination of semiconductor, semimetal, or metal with positive and negative Seebeck coefficient.

Figure 3:
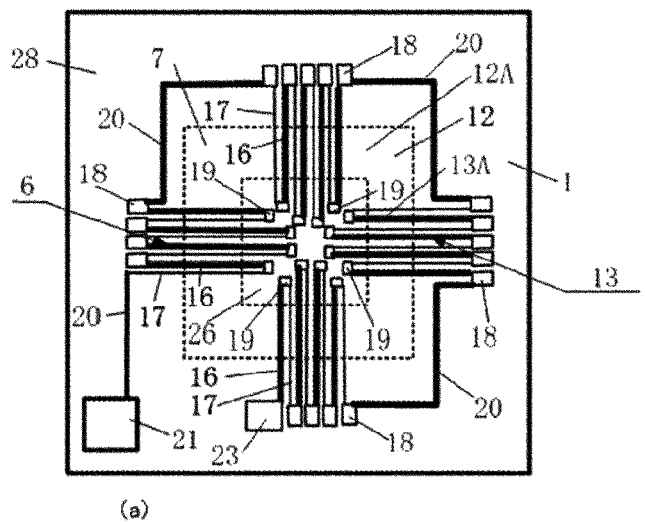
FIG. 3 is a structure diagram of each layered thermopile which constitutes a composite thermopile with multi-layered thin films of temperature sensor device according to the present invention applied for a thermal infrared sensor device, which shows 3 different types of layered thin film with layered thermopile pattern (a), (b), and (c) wherein an inorganic thin film is used for each thin film (embodiment 1 of the first invention).
Figure 3:
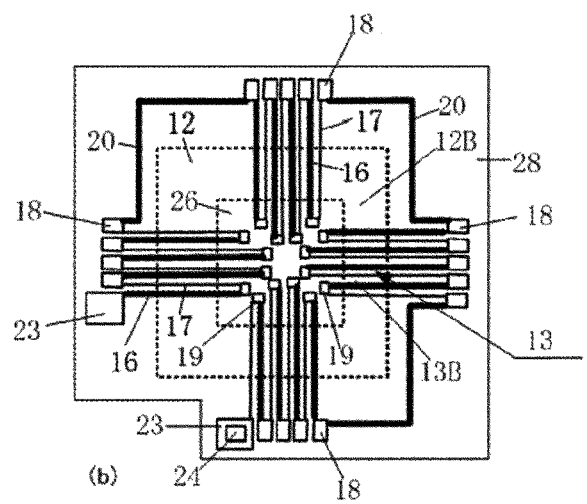
Figure 3:
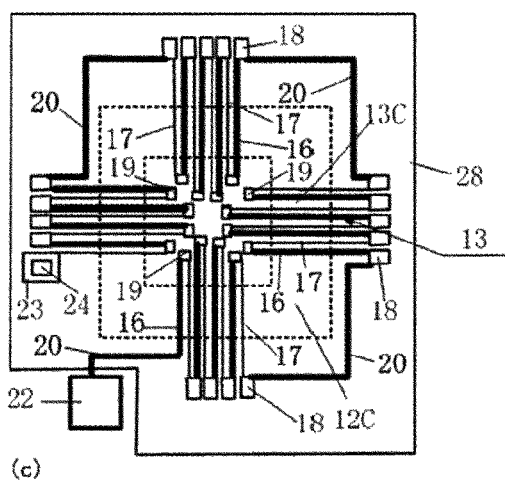

FIG. 3 is a plane view of an outline diagram of 3 different types of layered thin film with layered thermopile pattern (a), (b), and (c) to explain a composite thermopile by taking apart into layered thermopiles formed on each layered thin film which constitutes a composite thermopile with multi-layered thin films when a temperature sensor device according to the present invention which is applied for the above-mentioned thermal infrared sensor device wherein each layered thin film 12 as shown in FIG. 1 and FIG. 2 is made of an inorganic material such as silicon dioxide film, silicon nitride film, or the combination of these.

FIG. 3(a) is a diagram of an thermal infrared sensor device wherein a layered thin film 12A made of oxynitride thin film (a mixed film of silicon oxide and silicon nitride) whose expansion coefficient is adjusted to be same as that of silicon single crystal is formed by CVD on a substrate 1 made of silicon single crystal. This layered thin film 12A works for an electrical and thermal insulating film 28. In addition, in this figure, an embodiment is shown wherein a p-type polysilicon thin film as one thermal conducting body A16 of a thermocouple 6 is formed thereon by CVD and patterned and an aluminum thin film is formed thereon by sputtering and patterned to form a layered thermopile 13A. FIG. 3(b) and FIG. 3(c) are similar to FIG. 3(a). A layered thin film 12B, 12C is formed in each figure, a thermal conducting body A, B is formed thereon to form a layered thermopile 13B, 13C. When a multi-layered thin film 15 made of three layers as shown in this embodiment, the positions of an electrode 23, an electrode terminal A21, an electrode terminal B22, and so on, are necessary to be arranged to be different for each layered thin film 12A, 12B, and 12C by pattern change so as to ensure that each layered thermopile 13A, 13B, 13C are connected in series via connection parts 24 between upper and lower thin film.

As above mentioned, when an infrared sensor device of a temperature sensor device according to this invention is made of an inorganic thin film 2, it is not always necessary to use adhesive agent 27 to laminate thin films because layered thin films 12A, 12B, and 12C which constitute a thin film 2 can be formed by CVD. And each layered thin film 12A, 12B, and 12C can be made very thin, for example, in thickness of 0.1 μm by using known photo-lithography technology. And a heat conducting body A16, B17 can be made very compact which constitutes each layered thermopile 13A, 13B, and 13C in thickness of 1 µm and in width of 2 µm.

It is advantageous that, after an insulating layer 28 is formed on a thin layered film 12, a multi-layered thin film 15 is formed by forming a layered thermopile 13 thereon because there is wider selectivity on a layered thermopile 13 and a heat conducting body A, B. And it often happens that an insulating layer 28 is not only electrically insulating but also thermally insulating, which is preferable to support a very thin layered thermopile 13.

A thermal infrared sensor device as a temperature sensor device according to the present invention formed in the above-mentioned way can be treated as a device using a window part or a filter such as a silicon single crystal filter which is transparent in a desired infrared wavelength range, and being mounted in a metal or plastic package and attached to a known terminal to provide an external output. Needless to say, the device can be treated as an integrated module comprising a temperature sensor device wherein an amplifier which amplifies an electrical output signal, or an absolute temperature sensor 34 such as a thermistor or a p-n diode on the substrate 1.

Preferred Embodiment 2

Figure 4:
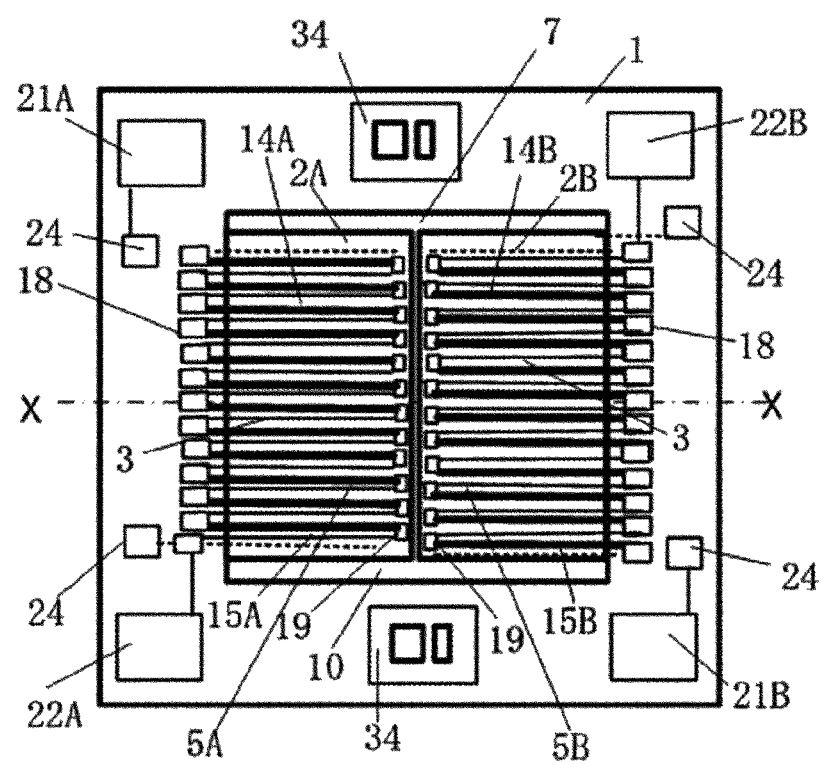
FIG. 4 is a plain view of an outline diagram to show an embodiment to explain a temperature sensor device according to the present invention, wherein a composite thermopile is composed of light receiving parts each of them having two multi-layered thin films (embodiment 2 of the first invention).

FIG. 4 is a plane view of an outline diagram of a structure to show an embodiment wherein a temperature sensor device according to the present invention is applied for an infrared sensor device using a thin film 2 as a temperature sensing part 5 at the light receiving part 7 made of inorganic material as explained in the aforementioned FIG. 2 and FIG. 3. In this embodiment, thin films 2A and 2B are formed as two temperature sensing parts 5A and 5B in the form of a cantilever in the same light receiving part 7. And composite thermopiles 14A and 14B are composed of multi-layered thin films 15A and 15B each having three-layered films. And multi-layered thin films 15A and 15B are composed of layered thermopiles 13 each having a layered thin film 12. For example, a p-n junction diode is formed on the substrate 1 as an absolute temperature sensor 34 to measure an absolute temperature of the substrate 1 as a reference temperature. The outputs of two different composite thermopiles 14A and 14B can be taken out respectively at terminal electrodes A21A, 21B and terminal electrodes B22A, 22B. In this plane view of the outline diagram, exploded views such as a layered thermopile 13 along the thickness direction of each multi-layered thin film 15A and 15B and an infrared absorption film 25 is omitted to avoid congestion.

A temperature difference between two points of objects under measurement can be measured by using an infrared lens system because two temperature sensing parts 5A and 5B in the form of a cantilever are formed. And also a temperature can be measured with high accuracy by receiving infrared light when one temperature sensing part 5A is shielded from infrared light and the other temperature sensing part 5B is subjected to infrared light from a point under measurement, and the difference of these outputs can be differentially amplified and detected.

The above-mentioned example is the case when two temperature sensing parts 5A and 5B in the form of a cantilever are formed. But a plurality of temperature sensing parts 5 in the form of matrix-like array can be formed on the same light receiving part 7 and used as an image sensor with an infrared sensor device array with high sensitivity and high accuracy.

The above-mentioned embodiment 2 is the case when thin films 2A and 2B are formed as two temperature sensing parts 5A and 5B in the form of a cantilever on the same light receiving part 7 and two composite thermopiles 14A and 14B are formed. In addition, when two thin films 2A and 2B are formed which are thermally isolated from each other and made of organic material such as a PET film on the same light receiving part 7, and a slit 36 is formed between these and two thin films 2A and 2B are formed, then two corresponding temperature sensing parts 5A and 5B can be thermally isolated. When two thin films 2A and 2B made of organic material such as a PET thin film are formed which are thermally isolated from each other, it is very difficult in view of strength to form two thin film 2A and 2B in the form of a cantilever and to form more than two separated films 2 unlike in the case when inorganic material is used. Therefore a pair of thin films 2A and 2B with a slit 36 is preferable. In this case, it is more preferable to form a thin film 2 of the light receiving part 7 in the form of a diaphragm and to extend the thin film 2 such as a plastic thin film in one direction and to select the length direction of the slit 36 so that the length direction corresponds to the extension direction because the width of the slit 36 is highly resistant to be enlarged.

Preferred Embodiment 3

Figure 5:
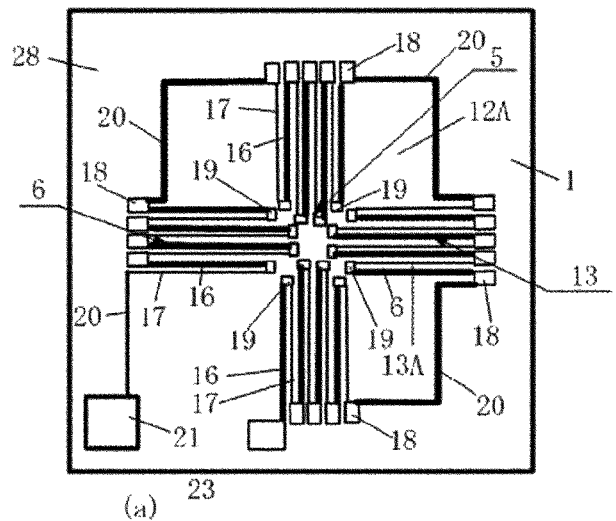
FIG. 5 is a disassembled structure diagram of each layered thermopile which constitutes a composite thermopile with multi-layered thin films of temperature sensor device according to the present invention applied for a thermal infrared sensor device, which shows 3 different types of layered thin film with layered thermopile pattern (a), (b), and (c) wherein an organic thin film for each thin film (embodiment 3 of the first invention).
Figure 5:
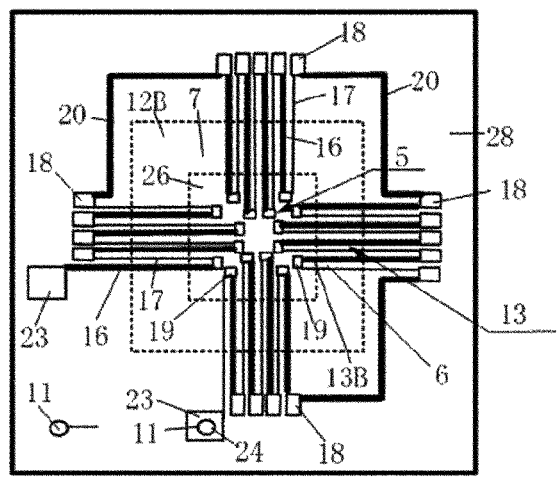
Figure 5:
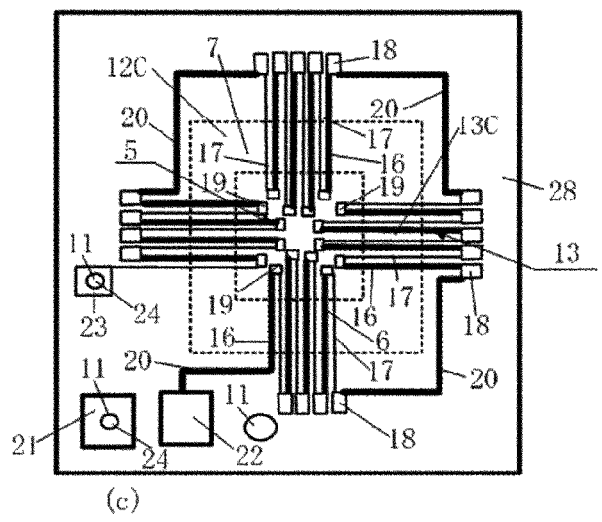
Figure 6:
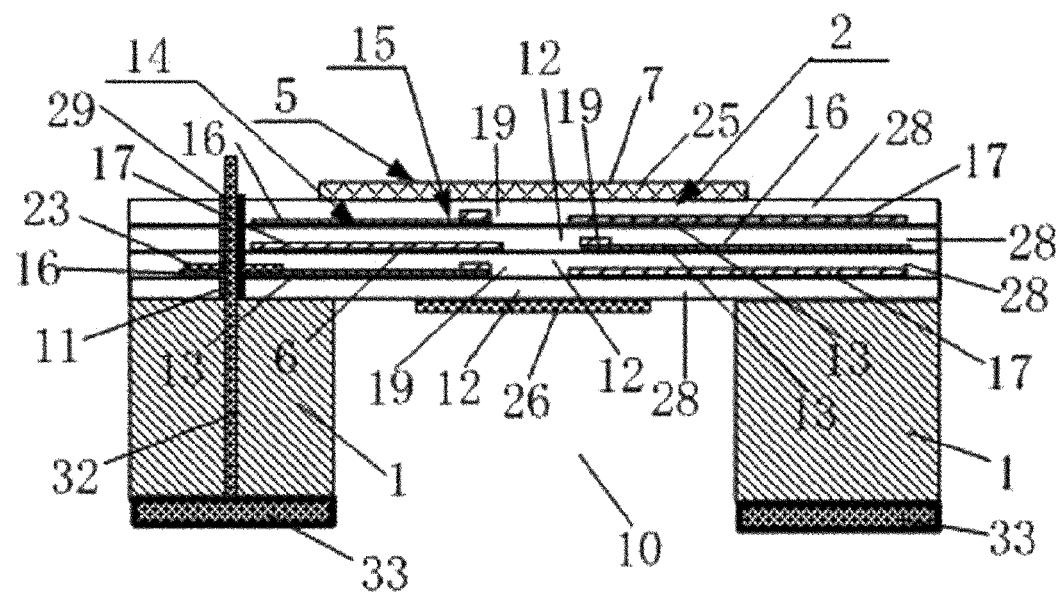
FIG. 6 is a cross-sectional outline diagram to show an embodiment to explain the concept of a temperature sensor device according to the present invention for a thermal infrared sensor device wherein an organic thin film for each thin film (embodiment 3 of the first invention).

FIG. 5 is a diagram to show an embodiment of a thermal infrared sensor device wherein each layered thin films 12A, 12B, 12C are made of organic thin films in FIG. 5(a), FIG. 5(b), and FIG. 5(c) which are diagrams to show the patterns of three layered thin films 12A, 12B, 12C and their layered thermopiles 13A, 13B, 13C to explain a composite thermopile 14 by disassembling a temperature sensor device according to the present invention into layered thermopiles 13A, 13B, 13C which are formed on each layered thin films 12A, 12B, 12C which constitute the composite thermopile 14 with the multi-layered thin film 15 of the device. FIG. 6 is a cross-sectional view of an outline diagram of a temperature sensor device surrounded by an isolation region wherein a multi-layered thin film 15 is bonded with the substrate 1 by an epoxy type adhesive agent 27, wherein three layered thin films 12A, 12B, 12C with layered thermopiles 13A, 13B, 13C as shown in FIG. 5 are laminated and bonded using coating adhesive agent 27 which also works as an insulating layer 28 to form the film 15. In this figure, an infrared absorption film 25 and a heat conducting thin film 26 such as a metal film are shown. In addition, the figure is a cross-sectional view of an outline diagram along the line which runs through a pin electrode 32 of an infrared sensor device having an external electrode terminal 33 to take out the output of the device. Also, a pin electrode 32 runs through the multi-layered thin film 15 via a through-hole 11, and the through-hole 11 is filled with electrically conducting material 29 such as conducting paste to ensure the electrical conduction with an electrode 23.

Figure 7:
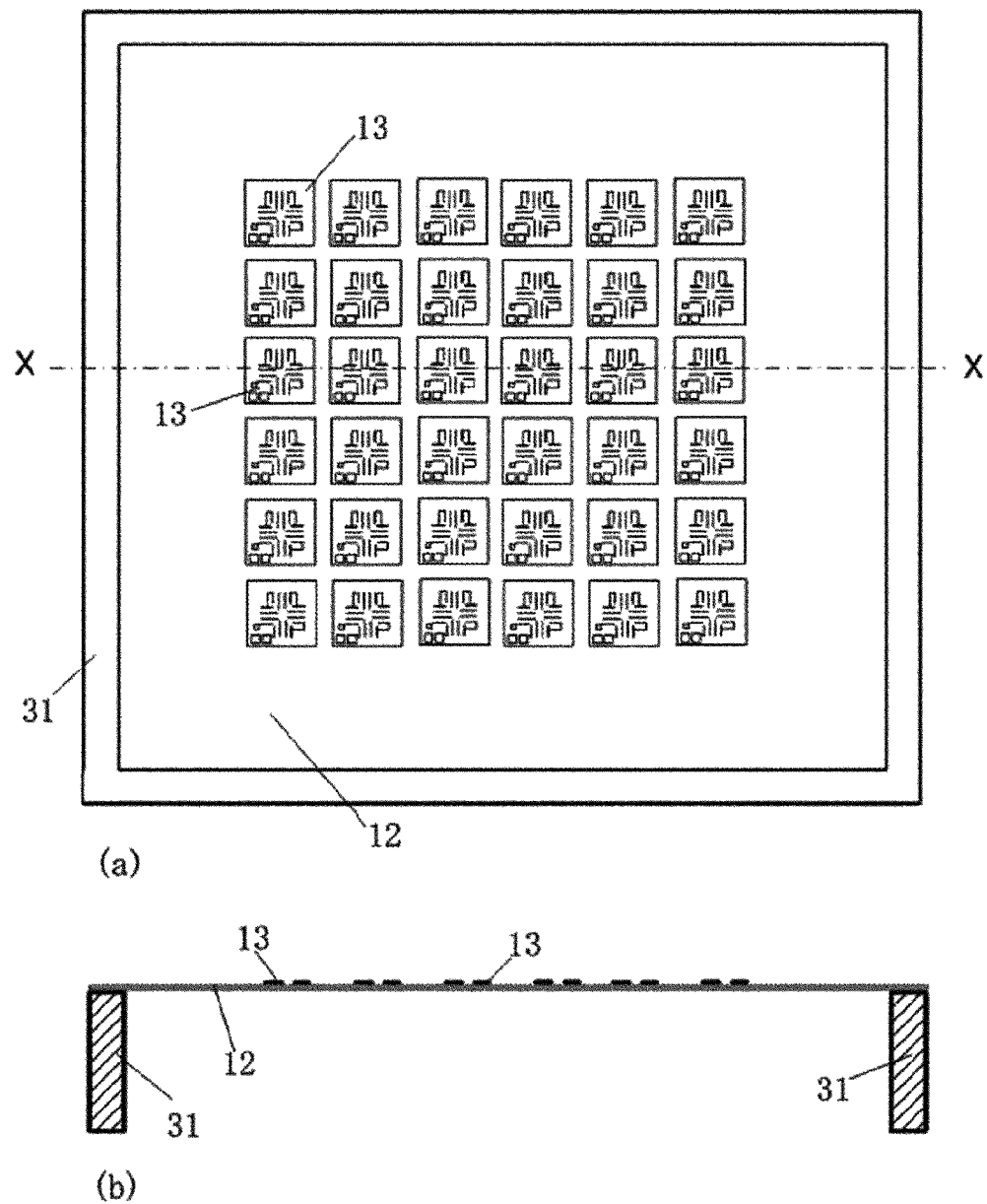
FIG. 7 is a structure diagram of an embodiment wherein an organic thin film is used for each thin film of a temperature sensor device according to the present invention, and a plurality of pattern arrays of a layered thermopile formed on each layered thin film are formed on one organic thin film.
Figure 8:
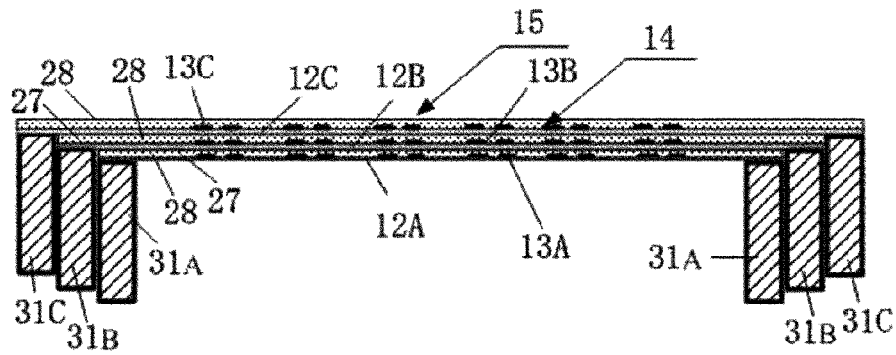
FIG. 8 is a cross-sectional outline diagram when a composite thermopile is formed by laminating and bonding a given number of sheets of a multi-layered thin film (3 sheets in this diagram) prepared from each layered thin film with a frame on which a plurality of pattern arrays of a layered thermopile are formed shown as a cross-sectional outline diagram in FIG. 7(*b*), wherein a temperature sensor device according to the present invention is formed using organic thin films (embodiment 3 of the first invention).

In order to produce an infrared sensing device as an inexpensive temperature sensor device in view of the production process of each layered thin films 12A, 12B, 12C using an organic thin film such as PET film, it is preferable to produce a composite thermopile 14 by the process steps comprising:

array preparation process preparing arrays of layered thermopiles 13A, 13B, 13C in large numbers on a organic thin film sheet such as a PET film which corresponds each layered thin films 12A, 12B, 12C, for example, as shown in FIG. 7;

array lamination process laminating these arrays to form a multi-layered thin film 15 as shown in FIG. 8;

array connection process connecting these arrays in series via connection parts between upper thin film and lower thin film so that thermoelectric force will be added and increased. Organic films such as a PET film can be formed as a sheet in a thickness of about 4 μm, and they have very low thermal conductivity. So a thermal infrared sensor device with high sensitivity can be produced by using these films.

A heat conducting body A16 of a thermocouple 6 which constitutes layered thermopiles 13A, 13B, 13C, can be made of, for example, Bi and a heat conducting body B17 can be made of, for example, Sb by vacuum deposition through a mask according to each pattern to form each layered thermopiles 13 (13A, 13B, 13C) as an array. FIG. 7(*a*), (*b*) show the device structure wherein a frame 31 is pasted on each layered thin films 12A, 12B, 12C by using adhesive agent 27 such as epoxy type material to form a multi-layered thin film 15 by laminating and bonding each layered thin film 12 and to give uniform tension to and facilitate the handling of each layered thin films 12A, 12B, 12C. FIG. 7(*a*) is a plane view of an outline diagram of each layered thin film 12 pasted by a frame 31, and FIG. 7(*b*) is a cross-sectional view of the outline diagram along a line X-X. In addition, FIG. 8 shows a cross-sectional view of an outline diagram when a multi-layered thin film 15 is formed by bonding each layered thin films 12A, 12B, 12C which is aligned and laminated after being uniformly stretched with each frame 31 attached. In addition, an adhesive agent 27 such as epoxy type material is preferable unlike an adhesive agent which becomes solidified utilizing the evaporation of solvent because the former becomes solidified by polymerization reaction. Needless to say, each layered thin films 12A, 12B, 12C made of an organic thin film such as PET can be bonded with each other by heat fusion.

Figure 9:
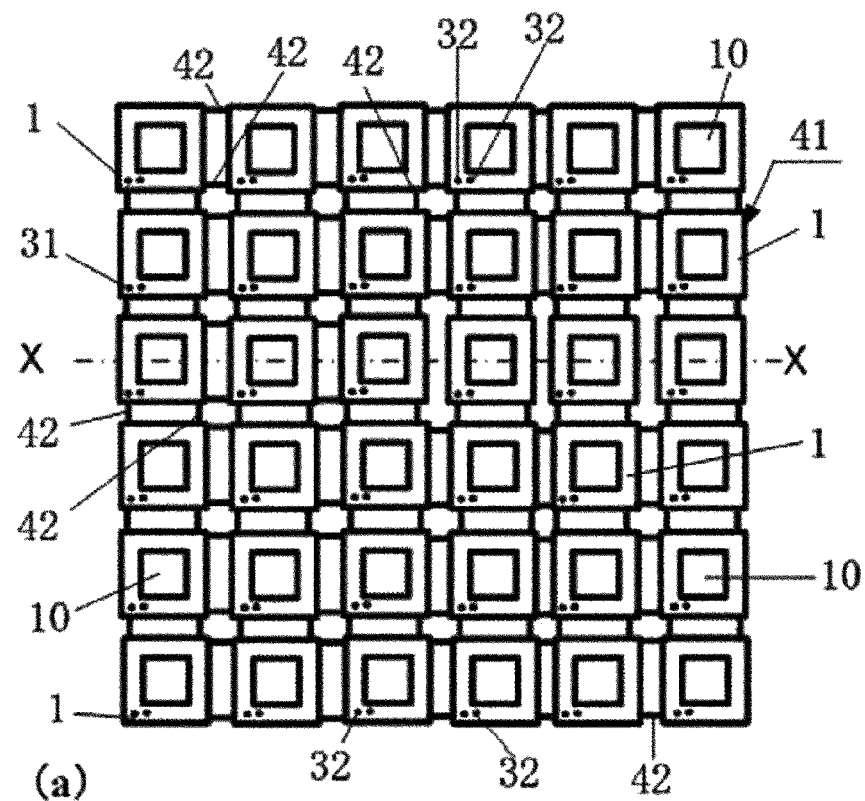
FIG. 9 is an outline structure diagram to show an embodiment of an array substrate where a multi-layered thin film of each composite thermopile is fixed when each layered thin film of a temperature sensor device according to the present invention is formed using organic thin films.
Figure 9:
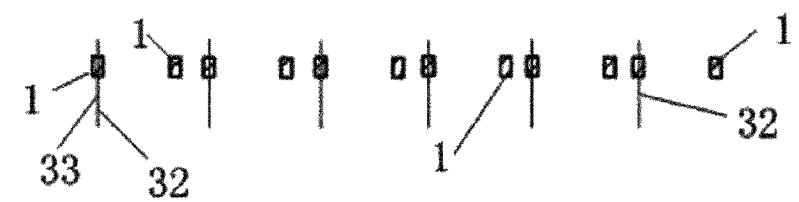

FIG. 9 shows a diagram of an array substrate 41 which is attached to a multi-layered thin film 15 wherein each layered thin films 12A, 12B, 12C as shown in FIG. 8 which is described above are laminated and bonded. FIG. 9(*a*) shows a plane view of an outline diagram of the array substrate 41 and FIG. 9(*b*) shows a cross-sectional view of the outline diagram along a line which runs through one pin electrode 32. Each substrate 1 which constitutes the array substrate 41 is connected via an array substrate connection part 42 with each other. This connection part is made thin in order to be cut easily. Two pin electrodes 32 are formed on each substrate 1 to be used as output terminals 33.

Figure 10:
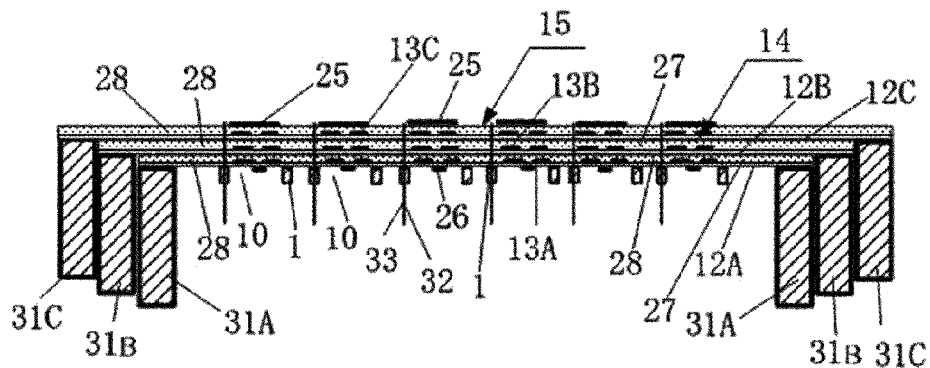
FIG. 10 is relating to an embodiment of a thermal infrared sensor device using organic thin films for each layered thin film of a temperature sensor device according to the present invention, and is a cross-sectional outline diagram along a line which runs through the position of a pin electrode when an array substrate shown in FIG. 9 is connected to a composite thermopile wherein 3 sheets of a multi-layered thin film shown in FIG. 8 are laminated and bonded (embodiment 3 of the first invention).

FIG. 10 shows a cross-sectional view of an outline diagram along a line which runs through one pin electrode 32 when a multi-layered thin film 15 is formed by bonding each layered thin films 12A, 12B, 12C which is laminated and bonded after being uniformly stretched with each frame 31 attached as shown in FIG. 8 and an array substrate 41 is aligned and pasted thereon. In this embodiment, a temperature is preferably used as a reference temperature, the temperature being measured by an absolute temperature sensor 34 such as a platinum thin film resistor, a thermistor, a p-n junction diode, and so on, which is not shown in the figure.

Preferred Embodiment 4

Figure 11:
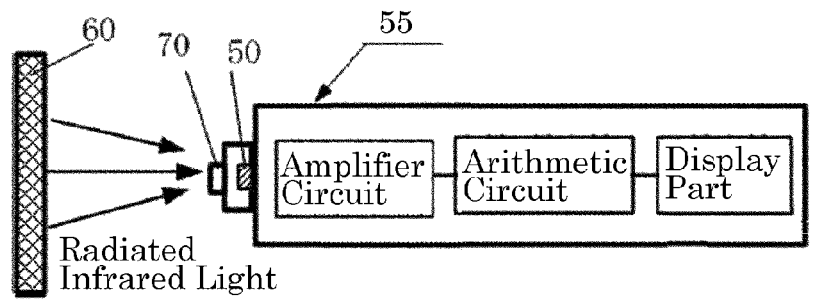
FIG. 11 is a conceptual diagram of a radiation thermometer when a temperature sensor device according to the present invention is used as an infrared sensor device (embodiment 4 of the first invention).

FIG. 11 is a conceptual diagram of a radiation thermometer when a temperature sensor device according to the present invention is used as an infrared sensor device. This device is a radiation thermometer 55 when a temperature sensor device according to the present invention is used as an infrared sensor device to detect radiated infrared light emitted from an object under temperature measurement 60. A radiation thermometer 55 with high sensitivity can be provided using an infrared sensor device with very high sensitivity. A radiation thermometer 55 receives infrared light emitted from an object under temperature measurement 60 to measure its temperature or temperature distribution, having a lens system 70 such as a germanium lens or a Fresnel lens, and an infrared sensor device according to the present invention being placed on the focal plane. When an infrared sensor array is used as an infrared sensor device, it can be used as an image sensor to measure a temperature distribution. And also, when one or several infrared sensor devices are placed, a temperature can be measured at a specific point or the highest temperature point of an object under temperature measurement 60.

In addition to this, a radiation thermometer 55 is equipped with an amplifier circuit to amplify a signal from an infrared sensor device, an arithmetic circuit to display temperature by signal processing, convert into temperature distribution, and create an image and display it, and further, a display part to display the number or the image of temperature. These circuits can be materialized by known technology, so the explanation of detail will be left out.

Preferred Embodiment 5

Figure 12:
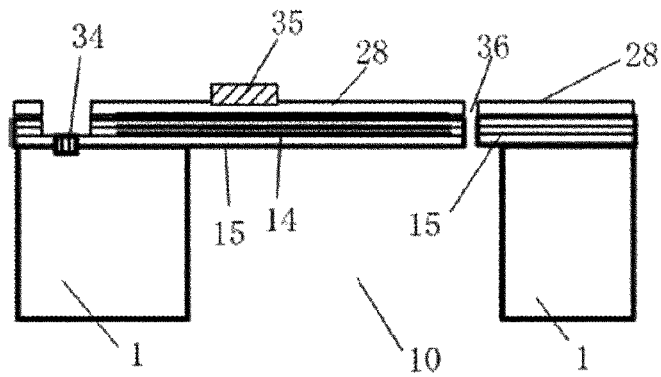
FIG. 12 is a conceptual diagram of a thermal conduction type sensor when a temperature sensor device according to the present invention is used as a thin film heater formed with a composite thermopile on the same multi-layered thin film (embodiment 5 of the first invention).

FIG. 12 is a conceptual diagram of a thermal conduction type sensor when a temperature sensor device according to the present invention is used as a thin film heater 35 formed with a composite thermopile 14 on the same multi-layered thin film 15. A structure wherein both the pattern of a composite thermopile 14 and the pattern of a thin film heater (a micro-heater) a 35 made of metal resistor thin film such as nichrome thin film are formed on a multi-layered thin film 15 using silicon single crystal substrate as a substrate 1. These series of pattern formation can be achieved by known photo-lithography technology. After these processes, a cavity 10 is formed by etching on the backside of the substrate 1. Then slits 36 are formed and a multi-layered thin film 15 can be formed which is thermally isolated from the substrate. The shape of the multi-layered thin film 15 can be the structure of a cantilever, or the structure wherein slits 36 are formed in a diaphragm. In this way, it is more preferable to form a multi-layered thin film 15 by forming a layered thermopile 13 on an insulating layer 28 after the insulating layer is formed on a layered thin film 12, because a very thin layered thin thermopile 13 can be supported.

If a temperature sensor device according to the present invention is applied for a heat conducting sensor, gas flow rate can be measured by the change in the output of the composite thermopile 14 based on the change in temperature when a thin film heater 35 is driven by electrical current applied with current value resulting a temperature rise of, for example, about 10 deg C. above room temperature under windless environment and the multi-layered thin film 15 is exposed in the gas flow, the heat of the film 15 heated being deprived to make the film cool down. In this mechanism, a gas flow sensor can be provided.

Preferred Embodiment 6

Figure 13:
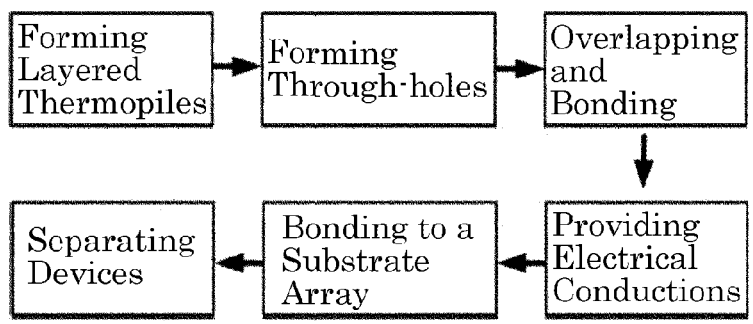
FIG. 13 is a block diagram to show characteristic process steps to explain a production method of a temperature sensor device when organic thin films are used for each layered thin film of a temperature sensor device according to the present invention (embodiment 6 of the first invention).

FIG. 13 is a block diagram to show characteristic process steps to explain a production method of a temperature sensor device when organic thin films are used for each layered thin film of a temperature sensor device according to the present invention. A production method of a temperature sensor device, wherein a composite thermopile, which is formed by laminating layered thermopiles on each layered thin film of an organic thin film and is placed in a temperature sensing part, is a method comprising:

layered thermopile fabrication process forming layered thermopiles on each organic layered thin films wherein the number of layered thin films are determined for appropriate lamination;

through-holes fabrication process forming through-holes for the electrical conduction of electrodes at desired positions on each layered thin films;

overlap-bonding process overlapping and bonding each organic layered thin films to form a multi-layered thin film;

conduction process providing electrical conductions between upper electrodes and lower electrodes via through-holes so that each layered thermopiles formed on each layered thin films are connected in series;

substrate-bonding process bonding a substrate array and the organic multi-layered thin film, the substrate array working as a heat-sink for discrete temperature sensor devices;

device-separation process separating each temperature sensor devices.

When each layered thin film 12 thermally isolated from the substrate 1 is formed as an organic thin film such as a PET film, it is difficult to form a multi-layered thin film 15 by CVD which is often used for forming inorganic thin films. Therefore, it is more inexpensive production method to paste and bond each layered thin films after each layered thermopiles 13A, 13B, 13C are formed on each layered thin films 12 (12A, 12B, 12C). The explanation about the process step to form a layered thermopile is already done in the above embodiment, so it will be left out here.

In through-holes fabrication process, electrical connection between upper thin film and a lower thin film of each layered thermopiles 13A, 13B, and 13C is needed when forming a multi-layered thin film 15 because each layered thin film 12 is electrically insulating. Then a through-hole 11 is used for connection part between upper thin film and lower thin film 24. Also, the through-hole 11 is needed for the electrical connection to an external electrode terminal 33 for providing output to external circuits and a pin electrode 32.

In addition, using films such as PET films, a through-hole 11 can be easily formed by using a pin or a blade-shaped jig being heated to about 400 degrees C. And also it can be easily formed by punching.

In laminated-layer-bonding process, laminated layers can be bonded by using epoxy system adhesive agent 27 or by thermal fusion bonding.

In conduction process, electrically-conductive material 29 such as conductive paste can be used for the electrical connection between a plurality of electrodes 23 or with other pin electrodes.

In substrate-bonding process, almost non-volatile epoxy system adhesive agent 27 can be preferably used.

In a substrate array, a number of temperature sensor devices are formed as an array. In device isolation process, a multi-layered thin film 15 is first cut off by using a heated blade-shaped jig. Thereafter, an array substrate 41 is disconnected. An array substrate 41 made of plastic material can be easily cut off by using metallic blade because an array substrate connection part is designed to be narrow and low in physical strength.

In the above embodiment, the case when a temperature sensor device according to the present invention is used as a thermal infrared sensor device is mainly explained. The temperature sensor device according to the present invention is the most preferable device to detect the difference of temperature by utilizing it as a temperature sensor other than an infrared sensor device. For example, a heat-conduction type sensor can be formed by forming a temperature sensor device according to the present invention with a micro heater on a thin film 2 thermally isolated from a substrate 1 in the form of a diaphragm or a cantilever. By using this heat-conduction type sensor, an extremely-compact heat-conduction type sensor with high sensitivity and high accuracy (for example, with a temperature sensing part of 100-µm-square in size) can be provided as a flow sensor, an atmospheric pressure sensor (including a vacuum sensor), a gas sensor including a hydrogen sensor and moisture sensor, an extremely-compact thermal analyzer to detect the change in enthalpy of material by temperature scanning of a micro heater.

A temperature sensor device according to the present invention is not limited to these embodiments described here. Needless to say, the present invention is also capable of other and different embodiments modified in various respects, all without departing from the sprit and scope of the present invention. Accordingly all these variations belong to the present invention.

The Second Invention

Preferred Embodiment 7

Figure 14:
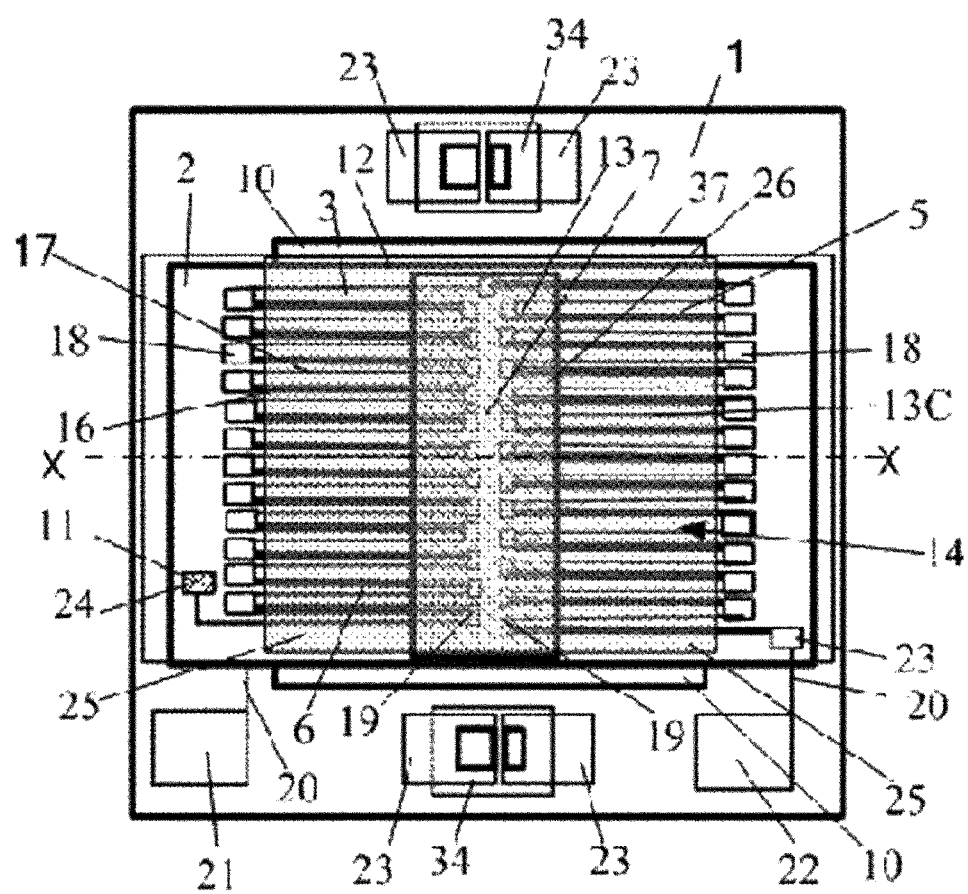
FIG. 14 is a plane view of an outline diagram to show an embodiment to explain the concept of a multi-layered thin film thermopile according to the present invention used for a thermal infrared sensor device (embodiment 7 of the second invention).
Figure 15:
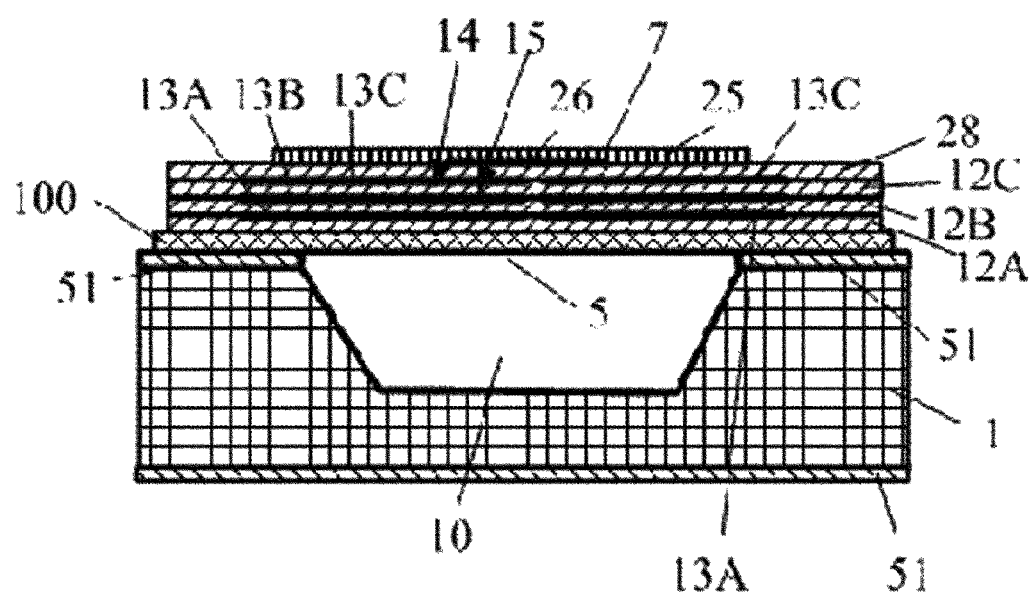
FIG. 15 is a cross-sectional outline diagram along the line X-X in FIG. 14 of a multi-layered thin film thermopile according to the present invention (embodiment 7 of the second invention).

FIG. 14 is a plane view of an outline diagram to show an embodiment to explain the concept of a multi-layered thin film thermopile according to the present invention used for a thermal infrared sensor device. FIG. 15 is a cross-sectional outline diagram along the line X-X. A multi-layered thin film 15 made of photo-resist film is formed as a bridge structure over a cavity 10 formed on the substrate 1, which is thermally isolated from the substrate 1 by the cavity 10. Layered thermopiles 13 (13A, 13B, 13C) are formed on layered thin films 12 (12A, 12B, 12C) mostly made of photo-resist films which constitute this multi-layered thin film 15. These thermopiles are connected in series via connection parts 24 between upper thin film and lower thin film using through-holes 11 formed on the photo-resist film itself which is photosensitive material by exposure and development process so that the thermoelectric force of thermopiles 13 placed on the upper and lower layers. These thermopiles as a whole are connected to form a composite thermopile 14 to output a signal based on the thermoelectric force of the composite thermopile 14 from an electrode terminal A21 and an electrode terminal B22. The multi-layered thin film 15 can be easily formed by spin-coated layered thin films 12 made of photo-resist films. These photo-resist films have strong adhesion force with each other. So generally, other adhesive agents are not necessary. In addition, a photo-resist film is photosensitive so that it can be easily formed as desired patterns with high accuracy. Then an electrode for a terminal, for example, an electrode terminal A21 and an electrode terminal B22 can be exposed, and through-holes 11 can be formed on each layered thin films 12 with high accuracy. In addition, one junction A18 (for example, a cold junction) of each layered thermopile 13 is placed on the substrate 1 with large heat capacity which functions as a heat-sink, and the other junction B19 (for example, a hot junction) is placed near the center of the bridge structure which functions as a temperature sensing part 5 in the light receiving part 7 on the multi-layered thin film 15 thermally isolated from the substrate 1. In this embodiment, the highest temperature point is near the center of the bridge structure of the light receiving part 7. To keep this region at uniform temperature, a heat conducting thin film 26 is formed near the center using a metallic thin film or a heat conductor, and so on, and the junction B19 is placed on the film.

When a multi-layered thin film thermopile according to the present invention is used for a thermal infrared sensor device, a multi-layered thin film 15 is thermally isolated from a substrate 1 via a cavity 10, the film 15 being bonded with each layered thin films (12A, 12B, 12C) wherein each layered thermopiles 13 (13A, 13B, 13C) are formed on an infrared light receiving part 7. Each layered thermopiles 13 (13A, 13B, 13C) are formed by thermocouples 6 with a plurality of thin films are connected in series, and they can also be formed by thermocouples 6 made of inorganic or organic thermoelectric material. In general, they are formed by thermocouples 6 made of thin films selected from the combination of semiconductors with positive and negative Seebeck coefficient, semimetals such as Sb and Bi, and metallic thin films.

In a multi-layered thin film thermopile according to the present invention, a sacrifice region 8 is formed by filling sacrifice material such as zinc in a cavity 10 formed beforehand in the substrate 1 as shown in FIGS. 14 and 15, and it is used as a substrate 1 having a sacrifice region 8 after planarization process. A thin film 100 for reinforcement is formed, if necessary, on the substrate 1, and a photo-resist film is formed by spin-coating which will be left as a multi-layered thin film 15. Then patterns including through-holes 11 are formed with high accuracy utilizing its photo-sensitivity, and a multi-layered thin film 15 and a composite thermopile 14 are formed, the film 15 comprising each layered thin films 12 and each layered thermopiles 13. A cavity 10 is formed by removing the sacrifice region 8 by etching (the region 8 is not drawn but only the cavity 11 is drawn in FIGS. 14 and 15) via etching holes 37 in the exposed region between the multi-layered thin film 15 and a region where a silicon oxide film 51 on the substrate 1.

Figure 16:
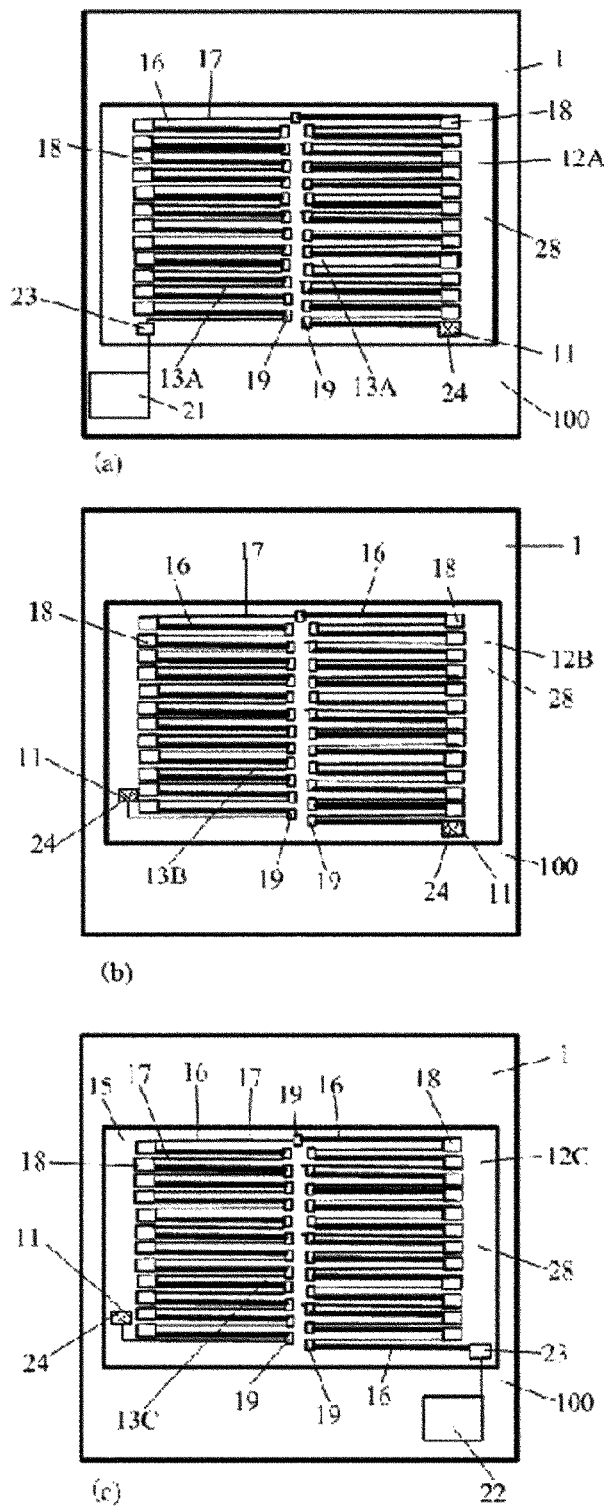
FIG. 16 is a plane view of an outline diagram of an embodiment of the structure of each layered thermopile 13 which constitutes a composite thermopile 14 of a multi-layered thin film 15 in a multi-layered thin film thermopile according to the present invention used for a thermal infrared sensor device. Three layered thin films 12 made of photo-resist film and the bottom layer (a), the interlayer (b), the top layer (c) of a layered thermopile formed thereon are shown (embodiment 7 of the second invention).

FIG. 16 shows a plane view of an outline diagram of each layered thermopile 13 which constitutes a composite thermopile of a multi-layered thin film 15 in a multi-layered thin film thermopile according to the present invention applied for a thermal infrared sensor device, and in the state before layered thin films 12 made of photo-resist films and a multi-layered thin film 15 are thermally isolated from the substrate. As one embodiment, three layered thin films and the bottom layer (a), the interlayer (b), the top layer (c) of a layered thermopile formed thereon are shown.

In the diagram of a thermal infrared sensor device as shown in FIG. 16(*a*), a substrate is prepared wherein a cavity 10 being formed beforehand on the substrate is filled with the same material as that of the sacrifice region 8 such as zinc and planarized, and if necessary a reinforcement thin film 100 is formed thereon. The reinforcement thin film 100 is preferably made of hard material such as a silicon oxide film in thickness of about 1 μm. The layered thin film 12A is preferably made of, for example, made of a polyimide-type negative photo-resist film by spin-coating. This layered thin film 12A made of a photo-resist film also functions as an electrically and thermally insulating layer 28. Each layered thin film 12 made of negative photo-resist film has an advantage that a desired pattern can be formed by the processes of exposure, development, and thermal hardening. At the same time, through-holes 11 can be formed with high accuracy at a desired position to provide electrical conductance between the upper and lower layers 12. In this figure, an embodiment is shown wherein a Bi thin film as one heat conducting body A16 of the thermocouple 6 is formed thereon by vacuum deposition, and the pattern of the object A16 is formed by liftoff technology of positive photo-resist, and a Sb thin film as the other heat conducting body B17 is formed by vacuum deposition, and the pattern of the object B17 is formed in the same way to form a layered thermopile. In FIGS. 16(*b*) and 16(*c*), a device structure is shown wherein a layered thin film 12B, 12C is formed respectively, and a heat conducting body A, B made of thermoelectric material is formed respectively thereon to form a layered thermopile 13B, 13C, as is the case in FIG. 16(*a*). As is the case for this embodiment wherein a multi-layered thin film 15 is formed made of three layered thin films 12, a composite thermopile 14 is formed by connecting each layered thermopile 13A, 13B, 13C which is formed on each layered thin film 12 in series via connection parts 24 between upper thin film and lower thin film placed in through-holes 11 formed on the layered thin film 12. In addition, to form an electrode 23, an electrode terminal A21, and an electrode terminal B22, preferably, a thin film is formed by vacuum deposition or sputtering of Al or oxidation-resistant Au, and their respective patterns are formed on this metallic film by using positive-type photo-resist which does not solve a negative-type photo-resist which constitutes each layered thin film 12.

Figure 17:
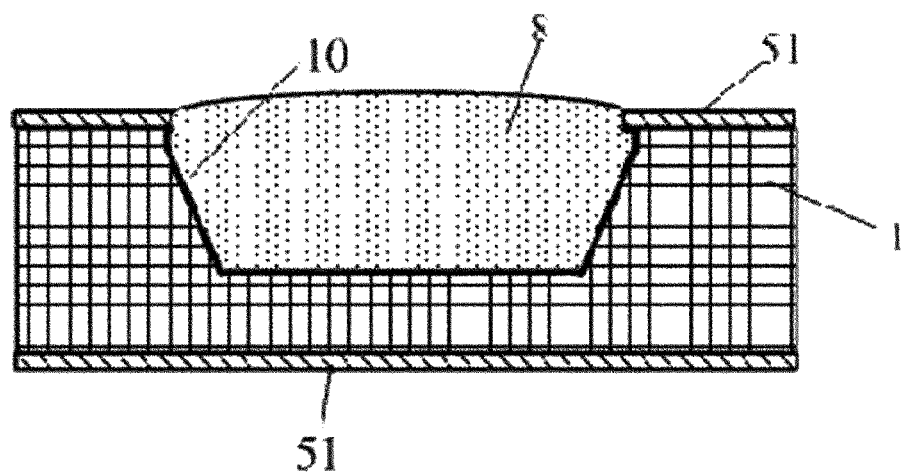
FIG. 17 is a cross-sectional outline diagram of a silicon substrate 1 when a cavity 10 is filled with metal material such as zinc as sacrifice material of a sacrifice region 8 after a cavity 10 is formed on a silicon single crystal substrate in midstream of a process steps to produce a multi-layered thin film thermopile according to the present invention (embodiment 7 of the second invention).

FIG. 17 is a cross-sectional outline diagram of a substrate when a cavity 10 is filled with metal material such as zinc as sacrifice material of a sacrifice region 8 after a cavity 10 is formed on a silicon single crystal substrate in midstream of a process steps to produce a multi-layered thin film thermopile according to the present invention. The cavity 10 is formed as a trench in the shape of four-sided pyramid surrounded by (111) plane using silicon anisotropic etchant such as hydrazine watery solution on the surface of the substrate 1 and etching mask of a thermally-oxidized SiO$_2$ film on (100) plane of the silicon single crystal substrate 1. If etching is stopped when the depth of the trench becomes appropriate before the shape becomes that of four-sided pyramid, a cavity 10 with its cross-sectional shape being so-called almost trapezoidal can be formed with a flat bottom part. A cross-sectional structure wherein a sacrifice region 8 is formed with a cavity filled with zinc and so on is shown in FIG. 17. As metallic material to fill the sacrifice region 8, it is preferable to use material with a melting-point temperature as low as possible, higher than the highest temperature used for the process to form photo-resist film in order to fill it by melting, which can be easily etched by etchant that does not solve a photo-resist film. Needless to say, there is no limitation on a melting-point when a sacrifice region is filled by plating. Zinc is preferable as material to fill the region by melting because it has low melting-point temperature and can be easily etched by dilute hydrochloric acid. It is possible to fill a silicon substrate by non-electrolytic Ni plating. So the side wall of the cavity 10 can be filled by zinc melting with improved wetting characteristics after non-electrolytic Ni plating on the side wall of the cavity 10. Needless to say, a cavity 10 can be filled by Cu plating to form a sacrifice region 8.

Figure 18:
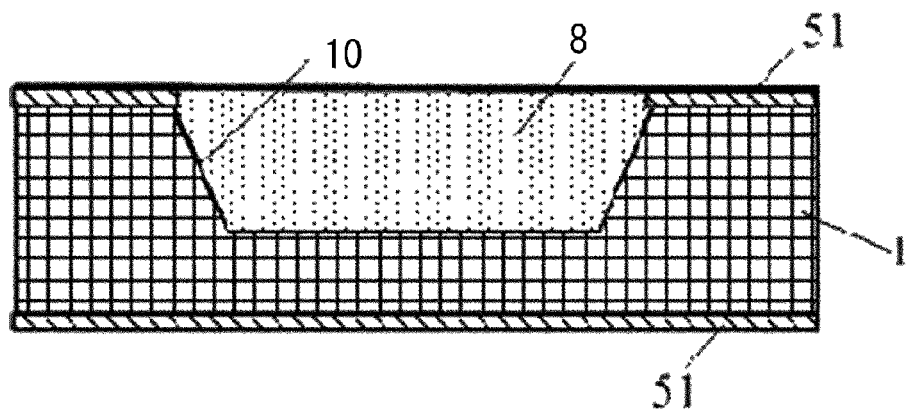
FIG. 18 is a cross-sectional outline diagram of a substrate 1 wherein bulging parts of the sacrifice region 8 are polished and planarized after a cavity 10 is filled with metal material such as zinc as sacrifice material of a sacrifice region 8 as shown in FIG. 17, or a casting mold including the cavity 10 is formed and planarized after the sacrifice region with heated and melted sacrifice material is covered by a planar plane when a cavity 10 is filled with sacrifice material of the sacrifice region 8 (embodiment 7 of the second invention).

FIG. 18 is a cross-sectional outline diagram of a substrate 1 wherein bulging parts of the sacrifice region 8 are polished and planarized after a cavity 10 is filled with metal material such as zinc as sacrifice material of a sacrifice region 8 as shown in FIG. 17, or a casting mold including the cavity 10 is formed and planarized after the sacrifice region with heated and melted sacrifice material is covered by a planar plane when a cavity 10 is filled with sacrifice material of the sacrifice region 8. It is preferable to pay attention so that material for the sacrifice region 8 such as zinc is not deposited on the region other than the cavity 10 on the substrate 1 as far as possible. Even if it is deposited, it is better to clean the surface of the substrate 1 by polishing until the height of the sacrifice region 8 on the cavity 10 reaches to the same as the height of the substrate 1. When sacrifice material which is the material of the sacrifice region 8 is left on the surface of the substrate other than the cavity 10, it is necessary to pay attention because, if a multi-layered thin film 15 is formed thereon, the film 15 is peeled off during a process to remove the sacrifice region 8 by etching.

A thermal infrared sensor device as a multi-layered thin film thermopile according to the present invention formed as described above is assembled as a device by being mounted with a window member or a filter in a metallic or plastic package and attached by known terminals to output electrical signals, the window member or the filter being transparent in the desired infrared wavelength region such as, for example, Si single crystal filter. Needless to say, the multi-layered thin film thermopile can be treated as an integrated module when other circuits or devices are formed on the same substrate 1, such as an amplifier to amplify electric signals, a thermistor, or an absolute temperature sensor 34 such as a p-n junction diode.

Figure 19:
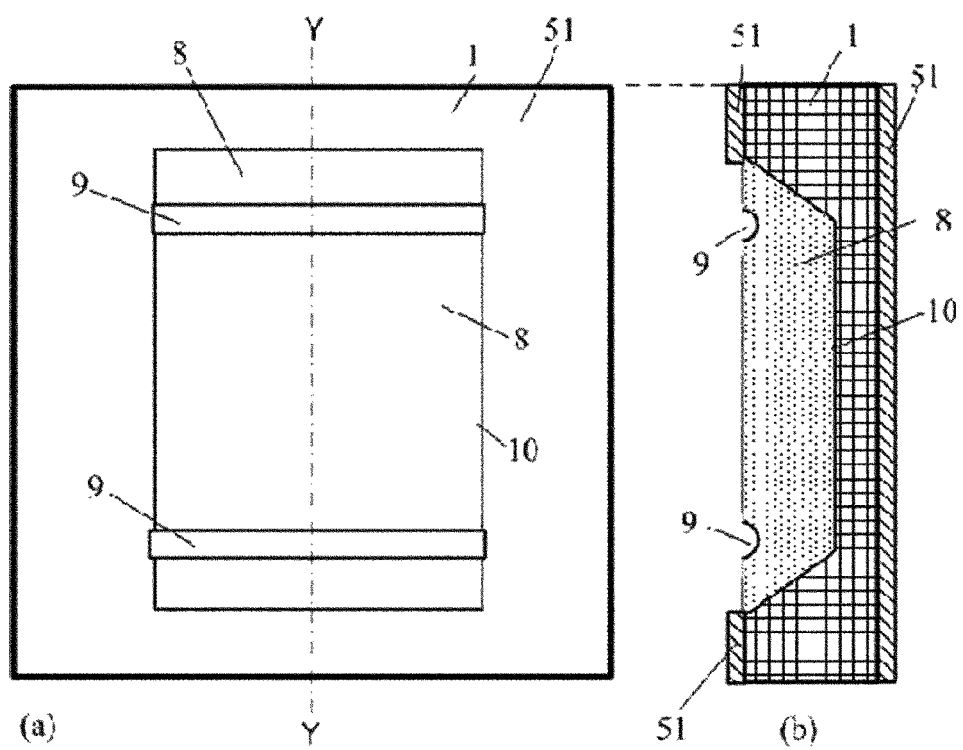
FIG. 19(*a*) is a plane view of an outline diagram to show an another embodiment to show a substrate when a cavity 10 is filled with metal material such as zinc as sacrifice material of the sacrifice region 8 after a cavity 10 is formed on the silicon single crystal substrate 1 in midstream of a process steps to produce a multi-layered thin film thermopile according to the present invention.

FIG. 19(*a*) is a plane view of an outline diagram to show an another embodiment to show a substrate 1 when a cavity 10 is filled with metal material such as zinc as sacrifice material of the sacrifice region 8 after a cavity 10 is formed on the silicon single crystal substrate 1 in midstream of a process steps to produce a multi-layered thin film thermopile according to the present invention. FIG. 19(*b*) is a cross-sectional outline diagram along the line Y-Y, wherein concavity and convexity 9 are formed (only concave portion is shown in this diagram), and bending strength is enforced by increasing the effective thickness of a multi-layered thin film made of photo-resist film formed thereon.

In FIG. 19, the cavity 10 is filled with metal such as zinc as sacrifice material of the sacrifice region 8, so the cavity 10 is, in fact, not hollow. However, this region is a region which will be a cavity 10 as shown in FIG. 20 by etching of the sacrifice region 8, and also it is a region where a cavity 10 has been formed, therefore, it is displayed as a cavity 10.

As shown in FIG. 18 as described above, a sacrifice region 8 is formed by filling sacrifice material in the cavity 10 of the substrate 1 and concavity and convexity 9 are formed (only concave portion is shown in this diagram) after planarization. This can be easily formed by photo-lithography technology. The depth of concavity and convexity 9 can be determined by the adjustment of etching time of sacrifice material using etchant such as dilute hydrochloric acid.

Figure 20:
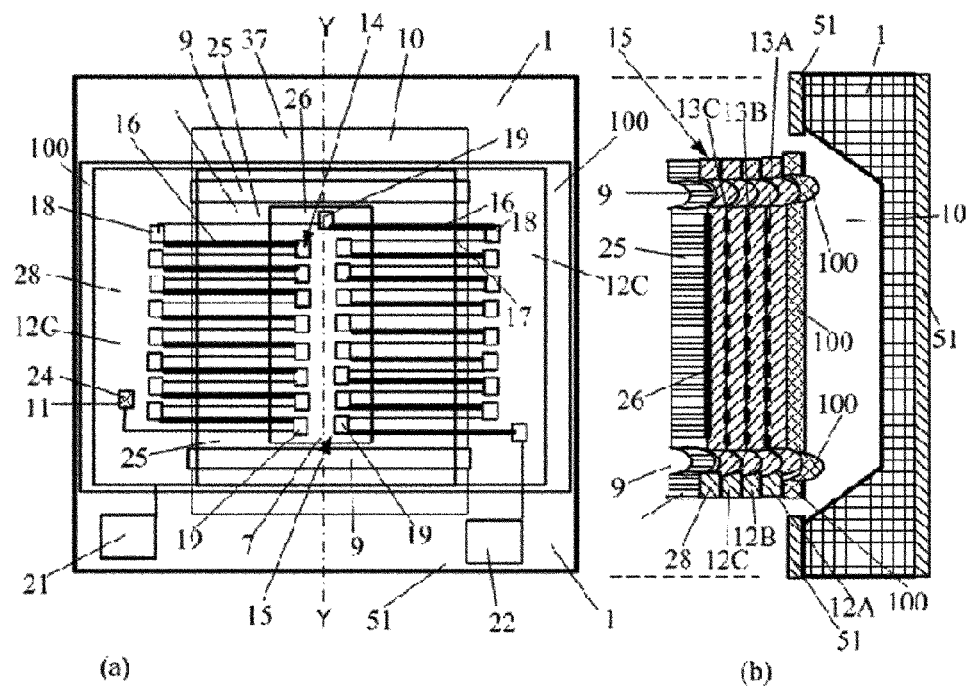
FIG. 20(*a*) is a plane view of an outline diagram to show an embodiment wherein a multi-layered thin film thermopile is formed by forming a concavity and convexity 9 on the sacrifice region in FIG. 19, and FIG. 20(*b*) is a cross-sectional view of the diagram along the line Y-Y (embodiment 8 of the second invention).

FIG. 20(*a*) is a plane view of an outline diagram to show an embodiment wherein a multi-layered thin film thermopile according to the present invention is formed by forming a concavity and convexity 9 on the sacrifice region in FIG. 19 to form a thermal infrared sensor device similar to the embodiment 1 as shown in FIG. 14 and FIG. 15. FIG. 20(*b*) is a cross-sectional view of the diagram along the line Y-Y. The difference between FIG. 14 and FIG. 17 is only in that a concavity and convexity is formed and the bending strength of the multi-layered thin film 15 is reinforced in FIG. 20. Accordingly, the explanation about function, effect, and behavior as a sensor will be left out here.

Preferred Embodiment 9

Figure 21:
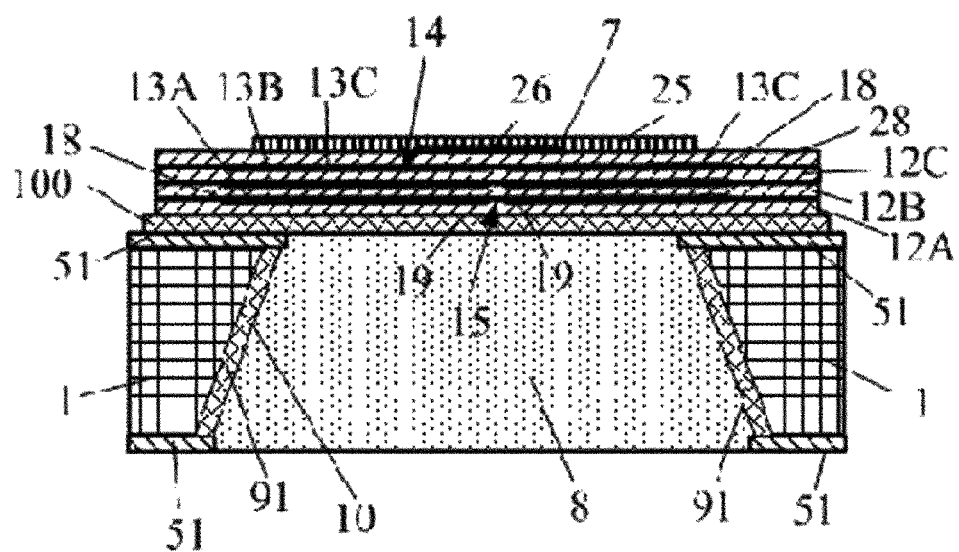
FIG. 21 is a cross-sectional view of an outline diagram to show an another embodiment to explain a multi-layered thin film thermopile according to the present invention wherein a sacrifice region 8 is formed by filling with sacrifice material such as zinc on a cavity penetrating in the thickness direction of the substrate 1 which is different from a cavity 10 not penetrating the substrate 1 as shown in FIG. 15 or FIG. 18 (embodiment 9 of the second invention).

FIG. 21 is a cross-sectional view of an outline diagram to show an another embodiment to explain a multi-layered thin film thermopile according to the present invention wherein a sacrifice region 8 is formed by filling with sacrifice material such as zinc on a cavity 10 penetrating in the thickness direction of the substrate 1 which is different from a cavity 10 not penetrating the substrate 1 as shown in FIG. 15 or FIG. 18. The cavity 10 is displayed in the figure because it is the process stage when sacrifice material is removed to form the cavity 10 although actually it is not hollow but filled with zinc as sacrifice material of the sacrifice region 8 in FIG. 21.

FIG. 21 shows a structure wherein a plated film 91 is formed beforehand by Ni non-electrolytic plating on an exposed silicon (111) plane on the substrate 1 having a cavity 10, and metal such as low melting-point such as zinc is filled thereon by heat melting. It can be filled by pulling out the substrate after soaking it in a container with metallic liquid inside made of the mixture of metal with low melting-point and its flux during a certain period. After that, a sacrifice region 8 is formed by filling the cavity 10 with low melting-point metal such as zinc, which is anew treated as a substrate 1. A thermal infrared sensor device can be formed by subsequent processes which are explained in the embodiment 1 and 2.

Preferred Embodiment 10

Figure 22:
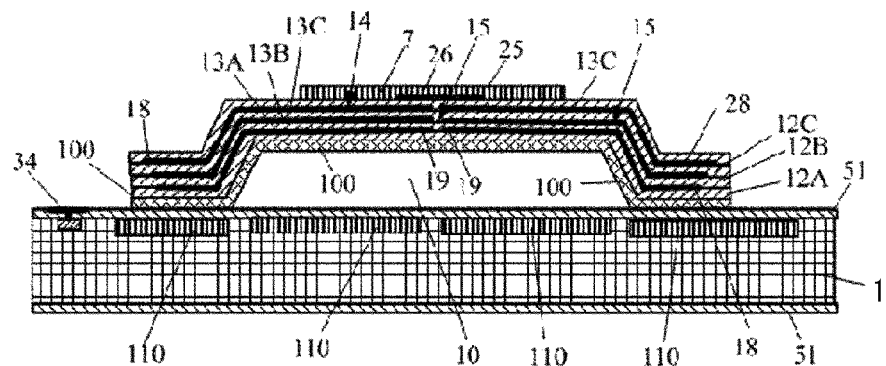
FIG. 22 is a cross-sectional view of an outline diagram to show an another embodiment to explain a multi-layered thin film thermopile according to the present invention wherein a cavity 10 is formed on a substrate 1, and a multi-layered thin film 15 having a composite thermopile 14 is formed on the substrate which is reinforced by a reinforcement film (embodiment 10 of the second invention).

FIG. 22 is a cross-sectional outline diagram to show an another embodiment to explain a multi-layered thin film thermopile according to the present invention wherein a cavity 10 is formed on a substrate 1, and a multi-layered thin film 15 having a composite thermopile 14 is formed on the substrate.

The device as shown in FIG. 22 is characterized in that an integrated circuit 110 can be formed on the surface of the substrate 1 just below the cavity 10 wherein a silicon single crystal is used for the semiconductor substrate 1 in, according to matured integration technology, and an integrated circuit 110 such as an arithmetic circuit, a memory circuit, a driver circuit of a sensor, and so on, and further an absolute temperature sensor 34 utilizing a diode or a transistor are formed on the substrate.

A multi-layered thin film 15 is produced, for example, by the following method, the film being mostly made of a photo-resist film having a composite thermopile 14 formed on the cavity. First, a sacrifice region is formed by a method such as plating of zinc, copper, or nickel in the form of a given shape that will be a cavity 10 by etching of the sacrifice region 8 on a silicon oxide film 51 formed on the silicon single crystal substrate 1 where the above-mentioned integrated circuit 110 and the absolute temperature sensor 34 are mounted. Subsequently, in this embodiment, a reinforcement thin film 100 such as a silicon nitride film is deposited by sputtering, and so on, on the substrate 1, the silicon nitride being hard material having an etchant in that an underlying silicon oxide film 51 is insoluble. During the deposition process, it is preferable to adjust a substrate temperature to reduce stress on the substrate. Shortly after the process, the reinforcement thin film 100 can be patterned in a given shape by photo-lithography technology. Or, the reinforcement thin film 100 can be patterned in a given shape utilizing the pattern of the multi-layered thin film 15 as an etching mask and the sacrifice region 8 is removed at the same time, after a multi-layered thin film 15 is formed and the upper insulating film 28 is patterned. After this reinforcement thin film 100 is formed, each layered thermopile 13A, 13B, 13C is sequentially formed on each layered thin film 12A, 12B, 12C by pattern formation and lamination to form a composite thermopile 14. In addition, in this embodiment, an insulating layer 28 and a layered thin film 12 is made of an identical photo-resist film. Photo-resist films for each layered thin film 12A, 12B, 12C and an insulating layer 28 are formed by spin-coating or coating in the same way as planarization process, or by spray-coating when the depth of the cavity 10 is large. In addition, one junction A18 (for example, a cold junction) of each layered thermopile 13A, 13B, 13C is formed with a large overlap on the substrate 1, wherein the thin film of each heat conductor of the array of thermocouples 6 is placed and extended along the cross-sectional plane of the cavity 10, the thin film being formed in close contact with the substrate 1. The other junction B19 (for example, a hot junction) of each layered thermopile 13A, 13B, 13C is formed near the center portion which is the highest temperature point in the multi-layered thin film 15 which forms a bridge over the cavity 10 when receiving infrared light. In this embodiment, a device structure is shown wherein a heat conduction thin film 26 is formed near the center of the multi-layered thin film 15 for heat collection and reinforcement. The infrared absorption film 25 can be formed by evaporation of gold black after forming a cavity 10 by removing the sacrifice region 8, as the final process of forming these thin films. Needless to say, depending on the selection of material for the infrared absorption film 25, the film 25 can be formed before the formation of the cavity 10.

A multi-layered thin film thermopile according to the present invention as shown in FIG. 22 can be used as a radiation thermometer. An integration circuit 110 can be formed on the substrate, the circuit such as an amplifier circuit to amplify signals from the composite thermopile 14, an arithmetic circuit or a memory circuit to process signals to display temperature, convert into temperature distribution, or display the image of the distribution, and so on. And further, a display unit for numerical or image display of temperature can be formed thereon to provide a radiation thermometer. These circuits can be produced by known technology, so detail explanation will be left out.

Figure 23:
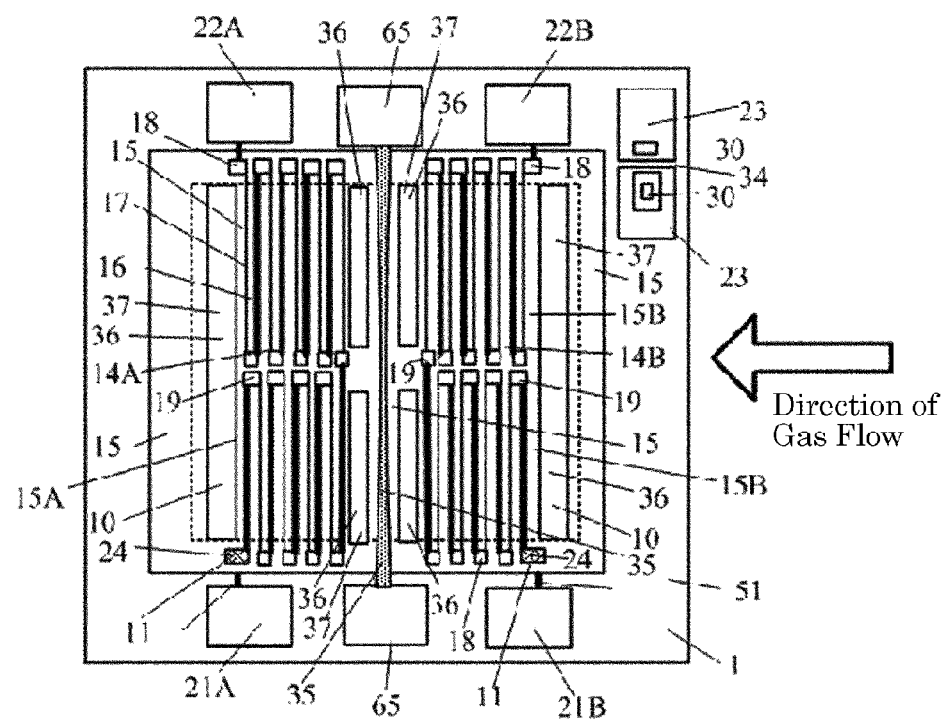
FIG. 23 is a plane view of an outline diagram to show an another embodiment to explain a multi-layered thin film thermopile according to the present invention wherein a composite thermopile 14 is formed with a thin film heater 35 to form a thermal conduction type sensor for applying a flow sensor to measure the flow of fluid such as gas (embodiment 11 of the second invention).

FIG. 23 is a plane view of an outline diagram to show an another embodiment to explain a multi-layered thin film thermopile according to the present invention wherein a composite thermopile is formed with a thin film heater to form a thermal conduction type sensor for applying a flow sensor to measure the flow of fluid such as gas.

When a multi-layered thin film thermopile is used as a heat conduction type sensor or a gas flow sensor to measure the flow of gas, electric current is applied to the thin film heater 35 via the heater electrode 65 with current value resulting a temperature rise of, for example, about 10 deg C. above room temperature under windless environment. When this multi-layered thin film 15 is exposed in the gas flow, heat is drawn from the heated multi-layered thin films 15A, 15B to cool the films down. The gas flow rate can be measured by utilizing prepared calibration data and by measuring the change in the output of the composite thermopiles 14A, 14B. In this mechanism, a gas flow sensor can be provided.

In this embodiment, slits 36 are formed on the multi-layered thin film 15, and a composite thermopile 14A and a composite thermopile 14B are respectively formed on the multi-layered thin film 15A at downstream side and on the multi-layered thin film 15B at upstream side to near the center of the bridge structure where the thin heater 35 is formed. A multi-layered thin film 15 in the center portion where the thin film heater 35 is placed, a multi-layered thin film 15A, and a multi-layered thin film 15B placed at either side of the film 15, are connected by the same multi-layered thin film 15 near the center of the bridge structure. The film 15A, 15B receives heat from the thin film heater 35 via this connection part and the temperature of the film rises. In windless environment, the temperature of the junction (a hot junction) near the center of the film 15A, 15B is almost constant, at a temperature of several deg C. lower than the temperature of the thin film heater 35. Under environment with gas flow, the film 15A at downstream side is heated further by the thin film heater 35, but the film 15B at upstream side is cooled down by gas flow of environment and its temperature drops. A very small gas flow rate or a change in gas flow can be measured by utilizing prepared calibration data and by measuring the difference between the outputs of the composite thermopiles 14A, 14B formed respectively on the multi-layered thermopiles 15A, 15B. Needless to say, a gas flow rate can be measured by utilizing single output data of the composite thermopile 14A, 14B. In this embodiment, an absolute temperature sensor 34 is formed on a silicon substrate 1.

Preferred Embodiment 12

Figure 24:
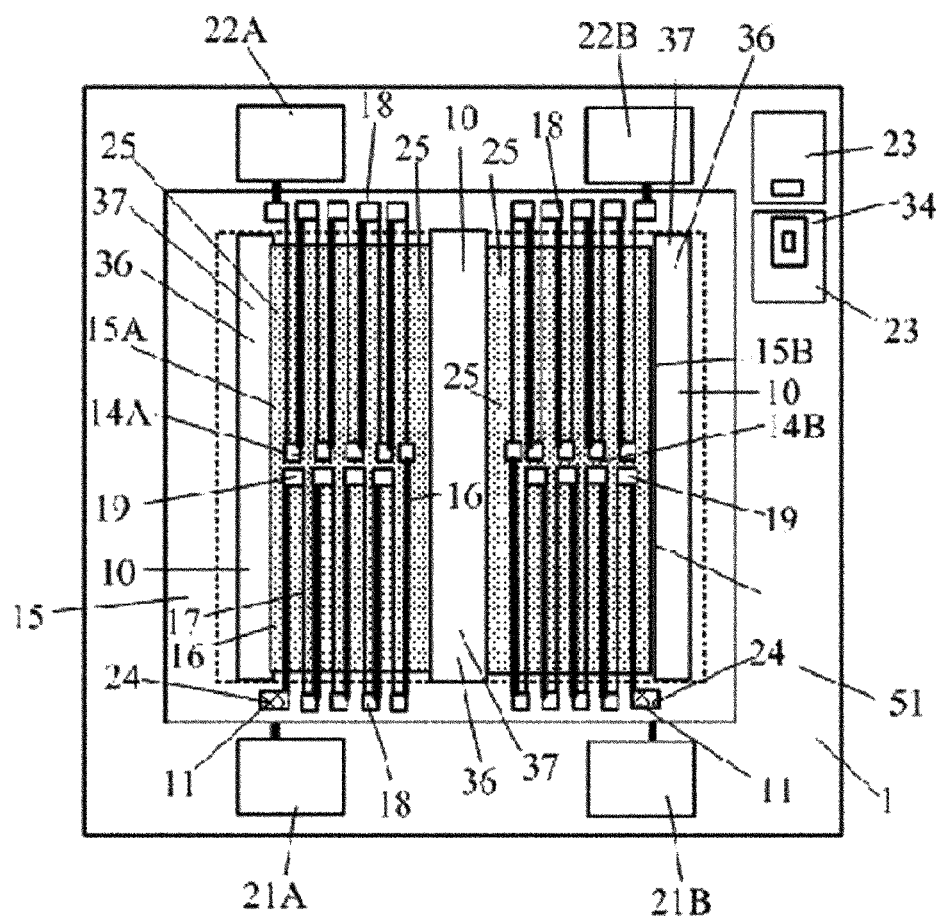
FIG. 24 is a plane view of an outline diagram to show an embodiment wherein a radiation thermometer is produced by using a multi-layered thin film thermopile according to the present invention which is applied for a thermal infrared sensor, and two composite thermopiles 14A and 14B are closely placed on the same cavity (embodiment 12 of the second invention).

FIG. 24 is a plane view of an outline diagram to show an embodiment wherein a radiation thermometer is produced by using a multi-layered thin film thermopile according to the present invention which is applied for a thermal infrared sensor, and two composite thermopiles 14A and 14B are closely placed on the same cavity.

An aural thermometer can be provided using a multi-layered thin film thermopile according to the present invention as a radiation thermometer by measuring radiation infrared light emitted from an object under temperature measurement. For example, the different temperatures of a drum membrane and an outer ear can be measured by two composite thermopiles 14A, 14B placed in a single cavity and the higher temperature can be considered as the temperature of drum membrane.

In addition, utilizing that a multi-layered thin film thermopile according to the present invention can be used as an infrared sensor device with very high sensitivity, using it as a radiation thermometer, non-dispersive infrared gas analyzer can be constructed utilizing a band-pass filter 1 which transmits only a specific absorption wavelength of gas under measurement, such as carbon oxide gas, and a band-pass filter 2 which transmits a wavelength that is not absorbed by the gas near the specific wavelength. Infrared light which passed through the band-pass filter 1 and the band-pass filter 2 is respectively received by the composite thermopile 14A and the composite thermopile 14B. The concentration of the gas under measurement can be measured using these outputs.

A device structure wherein two composite thermopiles 14A, 14B are formed on the same cavity 10 is shown in FIG. 24. It is easy to increase the number of the composite thermopiles 14, for example, to form 3 or 4 composite thermopiles.

Preferred Embodiment 13

Figure 25:
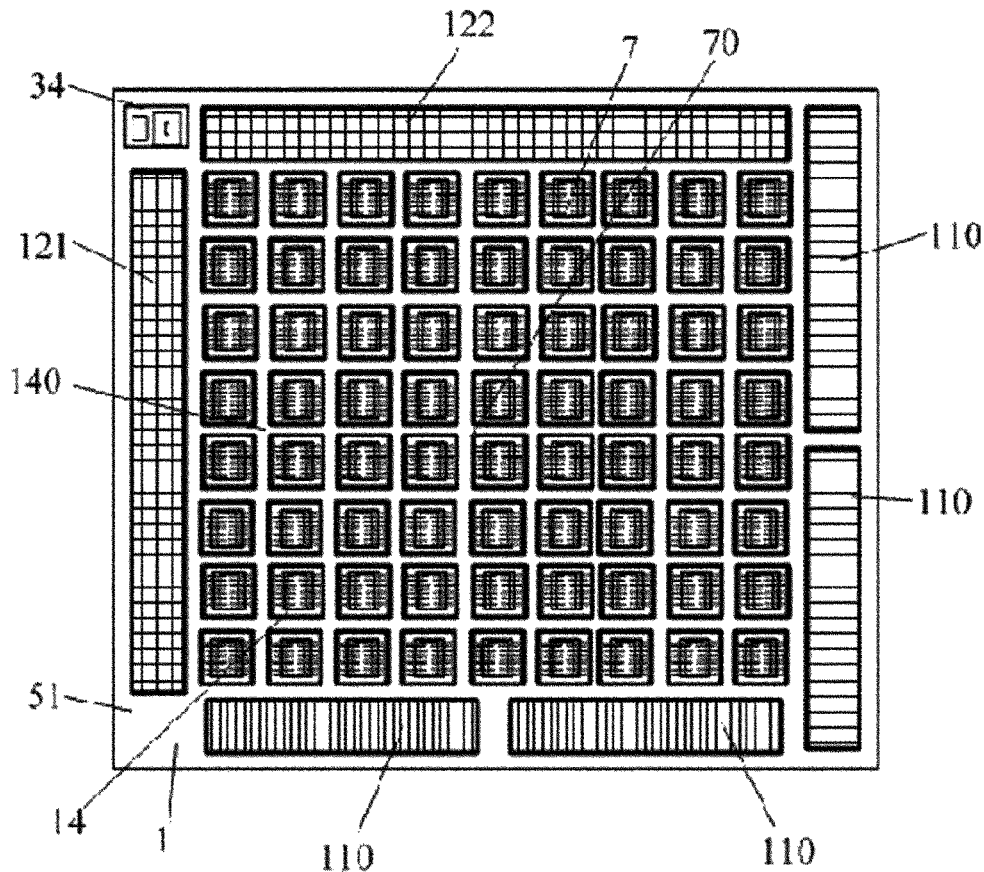
FIG. 25 is a plane view of an outline diagram to show an embodiment of a radiation thermometer applied for an image sensor using a multi-layered thin film thermopile according to the present invention wherein a composite thermopile array 140 is formed on the same substrate as a multi-layered thin film thermopile array (embodiment 13 of the second invention).

FIG. 25 is a plane view of an outline diagram to show an embodiment of a radiation thermometer applied for an image sensor using a multi-layered thin film thermopile according to the present invention wherein a composite thermopile array 140 is formed on the same substrate as a multi-layered thin film thermopile array.

An array of cavities 10 to thermally separate each multi-layered thin films 15 from the substrate 1 wherein each composite thermopiles 14 of a composite thermopile array 140 are formed can be an array of cavities 10 formed on the substrate 1 as shown in the embodiment 1, or an array of cavities 10 formed over the substrate 1 as shown in the embodiment 4 in FIG. 22. The array of cavities 10 formed over the substrate 1 is preferable for downsizing because an integrated circuit to process signals from a circuit such as a vertical scanning circuit 121 or a horizontal scanning circuit 122 can be formed on the surface of the substrate just below the cavity 10, while it is somewhat difficult to produce it.

In this embodiment, a desired light receiving portion can be selected by control of a vertical scanning circuit 121 and a horizontal scanning circuit 122 in an image sensor formed on the silicon single crystal substrate 1, the image sensor having an light receiving array 70 wherein each infrared receiving parts 7 as pixels of the sensor are placed in the form of two-dimensional array on a x-y plane. And horizontal and vertical scanning are enabled as an image sensor using these circuits. And output signals from the composite thermopiles 14 formed on each light receiving part 7 are processed by an integrated circuit as an amplifier and an arithmetic circuit placed in the same substrate 1, and are processed by another integrated circuit for image sensor display formed on the substrate 1 to display an image on a display device placed out of the substrate 1.

The above-mentioned radiation thermometer, having lens system such as germanium lens or fresnel lens, with the light receiving part 7 of a multi-layered thin film thermopile a composite thermopile array 140 according to the present invention at its focal plane, receives infrared light emitted from an object under temperature measurement, measures its temperature or temperature distribution, and displays the temperature of a specified position or the temperature distribution around the position, and further, displays their image.

When above-mentioned multi-layered thin film thermopile is used as a thermal infrared sensor device or an infrared image sensor, if its light receiving part 7 or light receiving array 70 is exposed in gas at a pressure of 1 atm., the sensitivity of the device becomes smaller due to heat conduction to surrounding gas. Therefore, it is preferable to mount the device in a vacuum sealed package in order to use the light receiving part 7 or the light receiving array 70 placed in a vacuum environment.

Preferred Embodiment 14

Figure 26:
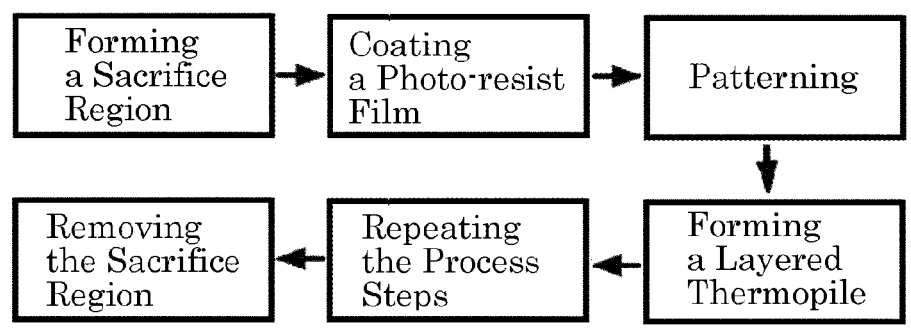
FIG. 26 is a block diagram to show characteristic process steps to explain a production method of a multi-layered thin film thermopile according to the present invention (embodiment 14 of the second invention).

FIG. 26 is a block diagram to show characteristic process steps to explain a production method of a multi-layered thin film thermopile according to the present invention.

The production method comprises process steps including:
sacrifice region fabrication, after forming a precise cavity with a given shape, forming a sacrifice region 8 on a substrate 1 by filling the cavity;
photo-resist coating process coating a photo-resist film which covers the sacrifice region 8 and the substrate 1;
photo-resist patterning process patterning the photo-resist film by exposure;
layered thermopile fabrication process forming a layered thermopile 13;
repeating the process steps from the photo-resist coating process to the layered thermopile fabrication process to form a multi-layered thin film 15;
subsequently sacrifice region removing process removing the sacrifice region 8.

In the above-mentioned embodiment, the case wherein a multi-layered thin film thermopile is utilized as a thermal infrared sensor device and the case wherein a thin film heater 35 is formed to form a heat conduction type sensor for applying a gas flow sensor are mainly explained. By using this heat-conduction type sensor, an extremely-compact heat-conduction type sensor with high sensitivity and high accuracy (for example, with a temperature sensing part of 100-μm-square in size) can be provided as a flow sensor, an atmospheric pressure sensor (including a vacuum sensor), a gas sensor including a hydrogen sensor and moisture sensor, an extremely-compact thermal analyzer to detect the change in enthalpy of material by temperature scanning of a micro heater.

In the above-mentioned embodiment, the case is mainly explained wherein a multi-layered thin film 15 with a bridge structure is used. However a multi-layered thin film 15 can be formed in the form of a diaphragm or a cantilever and can be thermally isolated from the substrate 1.

A heat conduction type sensor can be formed by forming a composite thermopile 14 which is a multi-layered thin film thermopile according to the present invention with a thin film heater 35. By using this heat-conduction type sensor, an extremely-compact heat-conduction type sensor with high sensitivity and high accuracy (for example, with a temperature sensing part of 100-μm-square in size) can be provided as a flow sensor, an atmospheric pressure sensor (including a vacuum sensor), a gas sensor including a hydrogen sensor and moisture sensor, an extremely-compact thermal analyzer to detect the change in enthalpy of material by temperature scanning of a micro heater.

And a composite thermopile 14 can be formed on a multi-layered thin film 15 mostly made of a photo-resist film which is independently prepared for a temperature sensor after a thin film heater 35 is separately formed on an inorganic thin film which is high-temperature resistant such as an SOI layer or a silicon oxide film when the device is used in a high temperature environment at about 500 deg C. A thin film heater 35 can be separately formed in the region wherein a silicon oxide film 51 is, for example, formed in the form of a cantilever on the surface of the substrate 1.

In the above-mentioned embodiment, the device structure wherein a silicon single crystal is used for the material of a substrate 1 is shown. Needless to say, semiconductor material such as germanium, silicon germanium, gallium arsenide, gallium phosphide, silicon carbide can be used for the material. And aluminum substrate or a glass substrate such as quartz can be sued unless crystallinity is utilized, or an integrated circuit is formed on the substrate 1.

A multi-layered thin film thermopile using a photo-resist film according to the present invention, a radiation thermometer using this, and a production method of the multi-layered thin film thermopile are not limited to these embodiments described here. Needless to say, the present invention is also capable of other and different embodiments modified in various respects, all without departing from the sprit and scope of the present invention. Accordingly all these variations belong to the present invention.

INDUSTRIAL APPLICABILITY

The First Invention

As above mentioned, a temperature sensor device according to the present invention is a temperature sensor device which is compact and can be produced with low cost, having a thermopile 6 in a temperature sensing part 5, the thermopile 6 being formed on a thin film 2 thermally isolated from the substrate 1, the thin film 2 having a plurality of multi-layered thin films 15 connected together, each layered thin film 12 of the films 15 having layered thermopiles 13. Both inorganic material and organic material can be used for the thin film 2. And the device according to the present invention can be applied for a thermal infrared sensor or a flow sensor as a temperature sensor device with high S/N ratio. Accordingly, the device is promising for the application as an infrared light radiation thermometer wherein a very small temperature difference needs to be measured with high accuracy and high sensitivity, especially as a temperature difference sensor of an aural thermometer, and is most suitable for a flow sensor which detect a very small flow rate of liquid or gas, a gas detector of hydrogen gas etc. by the measurement of a very small amount of heat generation in a sensor of flammable gas such as hydrogen gas etc., a heat conduction gas sensor, a Pirani gauge, a thermo-type humidity sensor, a pressure sensor such as an atmospheric sensor.

The Second Invention

As above mentioned, a multi-layered thin film thermopile according to the present invention is a temperature sensor device which is with high sensitivity and compact and can be produced with low cost, for detecting the difference of temperature wherein a thermopile 13 is placed in the temperature sensing part 5, the thermopile 13 being formed on a multi-layered thin film 15 mostly made of a photo-resist film thermally isolated from the substrate 1, the film 15 having a plurality of laminated layered thin films 12 where layered thermopiles 13 are respectively formed. And the layered thermopiles 13 on the upper and lower layer can be easily connected in series using through-holes 11 formed the photo-resist film itself. The device according to the present invention can be applied for a thermal infrared sensor with high sensitivity or a flow sensor as a temperature sensor device with high S/N ratio which can detect only temperature difference. Accordingly, the device is promising for the application as an infrared light radiation thermometer wherein a very small temperature difference needs to be measured with high accuracy and high sensitivity, especially as a temperature difference sensor of an aural thermometer, and is most suitable for a flow sensor which detect a very small flow rate of liquid or gas, a gas detector of hydrogen gas etc. by the measurement of a very small amount of heat generation in a sensor of flammable gas such as hydrogen gas etc., a heat conduction gas sensor, a Pirani gauge, a thermo-type humidity sensor, a pressure sensor such as an atmospheric sensor.

The invention claimed is:

1. A multi-layered film thermopile comprising:
   a substrate;
   a cavity;
   a multi-layered film, thermally isolated from the substrate by the cavity, composed of layered films;
   layered thermopiles formed on the layered films, the layered thermopiles on an upper film are connected in series with the layered thermopiles on a lower film, so as to increase the output of the composite thermopile being made of multi-layered films comprising a plurality of layered thermopiles thermally isolated from the substrate; and
   via through-holes formed on the layered films, and at least one composite thermopile is formed thereon, and the layered films which constitute the multi-layered film are mainly made of photo-resist film, and the through-holes are formed by exposure and development on the photo-resist film.

* * * * *